United States Patent
Toyoda et al.

(10) Patent No.: US 7,053,693 B2
(45) Date of Patent: May 30, 2006

(54) VOLTAGE GENERATING CIRCUIT, VOLTAGE GENERATING DEVICE AND SEMICONDUCTOR DEVICE USING THE SAME, AND DRIVING METHOD THEREOF

(75) Inventors: Kenji Toyoda, Osaka (JP); Michihito Ueda, Takatsuki (JP); Kiyoshi Morimoto, Hirakata (JP); Kiyoyuki Morita, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 183 days.

(21) Appl. No.: 10/765,175

(22) Filed: Jan. 28, 2004

(65) Prior Publication Data
US 2004/0183508 A1  Sep. 23, 2004

(30) Foreign Application Priority Data
Oct. 24, 2002 (JP) .............................. 2002-310032
Mar. 9, 2003 (JP) ....................... PCT/JP03/11227

(51) Int. Cl.
*G05F 1/10* (2006.01)
(52) U.S. Cl. ...................................... 327/536
(58) Field of Classification Search ............... 323/265, 323/266, 268, 271, 293; 327/534–538; 363/59, 363/60
See application file for complete search history.

(56) References Cited

U.S. PATENT DOCUMENTS 5,801,577 A * 9/1998 Tailliet ....................... 327/536
6,278,315 B1 * 8/2001 Kim ........................... 327/536
2002/0043676 A1   4/2002 Ohtsuka et al.
2003/0201820 A1 * 10/2003 Katsuhisa ................... 327/536
2004/0232974 A1 * 11/2004 Tobita ........................ 327/536

FOREIGN PATENT DOCUMENTS

| EP | 0576008 | * 12/1993 |
| JP | 02-188161 | 7/1990 |
| JP | 5-041080 | 2/1993 |
| JP | 06-119773 | 4/1994 |
| JP | 2003-92533 A | 3/2003 |
| JP | 2003-273352 A | 9/2003 |

* cited by examiner

*Primary Examiner*—Matthew V. Nguyen
(74) *Attorney, Agent, or Firm*—McDermott Will & Emery LLP

(57) ABSTRACT

A voltage generating circuit comprising a capacitor (4), a ferroelectric capacitor (6) serially connected to the capacitor (4), an output terminal (11), a capacitor (10) which grounds the output terminal (11), a supply voltage supplying terminal (13), a switch (1) which connects the supply voltage supplying terminal (13) and the connecting node (N1) of the two capacitors (4, 6), and a switch (9) which connects the connecting node (N1) and output terminal (11); wherein during a first period, with the two switches (1) and (9) placed in the OFF state, a terminal (3) is grounded and a terminal (7) is provided with a supply voltage; wherein during a second period, the terminal (3) is provided with the supply voltage and the switch (9) is placed in the ON state; wherein during a third period, the switch (9) is placed in the OFF state, the switch (1) is placed in the ON state, and the terminal (7) is grounded; wherein during a fourth period, the terminal (7) is provided with the supply voltage; and wherein thereafter the first through fourth periods are repeated.

20 Claims, 15 Drawing Sheets (a)

(b)

(a)

(b)

(a)

(b)

VOLTAGE GENERATING CIRCUIT, VOLTAGE GENERATING DEVICE AND SEMICONDUCTOR DEVICE USING THE SAME, AND DRIVING METHOD THEREOF

BACKGROUND OF THE INVENTION (1) Field of the Invention

The present invention relates to a voltage generating circuit and a voltage generating device which have the function of increasing an input voltage, a semiconductor device using the same, and a driving method thereof.

(2) Description of the Related Art

LSIs, which are constructed by integrating many MIS transistors, have been increasingly miniaturized in recent years. Miniaturization of MIS transistors has been progressing in close accordance with a scaling law. Because of this trend, gate oxide films are becoming ultrathin. Therefore, to prevent an increased leakage current passing through the gate oxide films, and to maintain reliability, a lower supply voltage is required. For example, according to a design rule that specifies a minimum gate length of 0.13 µm, the gate oxide film thickness is as thin as 1.5 to 1.9 nm and the supply voltage is as low as 1.2 to 1.5 V. When the potential of the gate of an MIS transistor and that of the source are equal, the potential of the drain is made lower than that of the source by the threshold voltage, creating a threshold voltage loss. This may lead to a reduced signal logic amplitude, and thus lowered reliability.

Such lowered reliability can be effectively prevented by supplying a raised voltage. It is possible to prevent loss of threshold voltage by supplying a voltage higher than the supply voltage to the gate of an MIS transistor using a voltage raising means. However, power to one system is preferably supplied from a single power source, because it is inefficient to provide two or more independent sources. One prior art technique that solves this problem is a bootstrap circuit, which generates a raised voltage from the supply voltage.

FIG. 14 is a circuit diagram showing the structure of a bootstrap circuit in the prior art. This bootstrap circuit comprises a first MIS transistor 101, which is an n-channel MISFET having a gate to which an input signal Vin is applied from an input terminal 110, and a second MIS transistor 102, which is an n-channel MISFET connected between a power line N101, which supplies a supply voltage Vdd, and the drain of the first MIS transistor 101. The connected portion of the first MIS transistor 101 and second MIS transistor 102 forms a node N102 (the node connected to the drain of the first MIS transistor 101 and the source of the second MIS transistor). The node N102 is connected to an output terminal 111 for outputting an output voltage Vout. A third MIS transistor 103 is an n-channel MISFET disposed between the gate of the second MIS transistor 102 and the power line N101. A supply voltage Vdd is applied to the gate of the third MIS transistor 103. A bootstrap capacitor 104 is between the node N102 and the connected portion of the gate of the second MIS transistor 102 and the source of the third MIS transistor 103, namely the node N103. A load capacitor 105 is connected between the output terminal 111 and the ground. Thus, the capacitor 104 and third MIS transistor 103 are provided so that the gate of the second MIS transistor 102 is floating at a high voltage. This enables the gate voltage of the second MIS transistor 102 to be raised higher than the supply voltage. It also enables the voltage of the node N102, i.e., the output voltage Vout outputted from the output terminal 111, to be maintained at the supply voltage Vdd as described below.

FIG. 15 shows the change over time in the input voltage Vin, output voltage Vout, and the voltage Vbt of the connecting node N103. When the input voltage Vin is 5 V, the output voltage Vout is 0 V since the first MIS transistor 101 is on. At this time, the voltage Vbt of the connecting node N103 has the value (Vdd−Vt3) lowered from the supply voltage Vdd by the threshold voltage Vt3 of the third MIS transistor 103. Subsequently, when the input voltage Vin is reduced from 5 V to 0 V, the output voltage Vout is increased because the first MIS transistor 101 is turned off. As the output voltage Vout rises, the voltage Vbt of the connecting node N103 is also increased by the capacitor 104. When the voltage Vbt rises above (Vdd−Vt3), the third MIS transistor 103 is turned off, and the gate of the second MIS transistor 102 becomes floating. Finally, the voltage Vbt of the connecting node N103 rises to (2 Vdd−Vt3). Since a sufficiently high voltage is applied to the gate of the second MIS transistor 102, the output voltage Vout rises to the supply voltage Vdd (=5V) without loss by the threshold voltage.

However, in this bootstrap circuit in the prior art, the electric charge of the capacitor 104 is reduced by current leakage. Therefore, the circuit has the problem that it is difficult to keep the voltage of the connecting node N103 at a raised voltage higher than the supply voltage over a long period. Another problem of the circuit is that if the voltage Vbt becomes floating while the voltage Vbt of the connecting node N103 is rising, the voltage Vbt becomes unstable because of the influence of the parasitic capacitance and parasitic resistance which exist in each part of the second and third MIS transistors 102 and 103.

BRIEF SUMMARY OF THE INVENTION

An object of the present invention is to provide a voltage generating circuit and a voltage generating device which can stably maintain a raised voltage over a long period by using a booster mechanism different from the booster circuit in the prior art mentioned above, a semiconductor device using the same, and a driving method thereof.

A first voltage generating circuit according to the present invention which achieves the above object comprises: a first capacitor, a second capacitor which is a ferroelectric capacitor serially connected to the first capacitor, an output terminal, a third capacitor which grounds the output terminal, a supply voltage supplying terminal, a first switch which connects a connecting node of the first and second capacitors and the supply voltage supplying terminal, and a second switch which connects the connecting node and the output terminal; wherein during a first period, with the first switch and the second switch placed in the OFF state, a first terminal of the first capacitor opposed to the connecting node is grounded and a second terminal of the second capacitor opposed to the connecting node is provided with a supply voltage; wherein during a second period following the first period, the first terminal is provided with the supply voltage and the second switch is placed in the ON state; wherein during a third period following the second period, the first switch is placed in the ON state, the second switch is placed in the OFF state, and the second terminal is grounded; wherein during a fourth period following the third period, the second terminal is provided with the supply voltage; and wherein thereafter the first through fourth periods are repeated.

A first method for driving a voltage generating circuit according to the present invention which achieves the above object comprises: in the above-described first voltage generating circuit according to the present invention; a first period during which a first terminal of the first capacitor opposed to the connecting node is grounded, a second terminal of the second capacitor opposed to the connecting node is provided with a supply voltage, and the first switch and the second switch are placed in the OFF state; a second period following the first period, during which the first terminal is provided with the supply voltage and the second switch is placed in the ON state; a third period following the second period, during which the first switch is placed in the ON state, the second switch is placed in the OFF state, and the second terminal is grounded; a fourth period following the third period, during which the second terminal is provided with the supply voltage; wherein thereafter the first through fourth periods are repeated.

A first voltage generating device according to the present invention which achieves the above object comprises: the above-described first voltage generating circuit according to the present invention; a control circuit for supplying to the voltage generating circuit driving signals for firstly placing the first switch and the second switch in the OFF state, grounding the first terminal, and providing the second terminal with the supply voltage, then secondly providing the first terminal with the supply voltage, placing the second switch in the ON state, then thirdly placing the first switch and the second switch in the ON and OFF states respectively, grounding the second terminal, and then fourthly providing the second terminal with the supply voltage; and a voltage detection circuit for detecting an output voltage at the output terminal; wherein the voltage detection circuit provides the control circuit with a control signal in response to the detected output voltage; and wherein the control circuit provides or stops providing the driving signals in response to the control signal.

A first method for driving a voltage generating device according to the present invention which achieves the above object is a method for driving a voltage generating device comprising; the above-described first voltage generating circuit according to the present invention, a control circuit for supplying to the voltage generating circuit driving signals, and a voltage detection circuit for supplying a control signal to the control circuit; the method comprises: a detecting step wherein the voltage detection circuit detects an output voltage at the output terminal in the voltage generating circuit; an enabling step wherein the voltage detection circuit provides an enabling signal so that the control circuit can provide the driving signals when the value of the output voltage is equal to or less than a first value, and the voltage detection circuit continues to provide the enabling signal until the value of the output voltage is equal to or more than a second value; a driving step wherein the control circuit provides the voltage generating circuit with the driving signals upon receipt of the enabling signal; a disabling step wherein the voltage detection circuit provides a stop signal so that the control circuit can stop providing the driving signals when the value of the output voltage is equal to or more than the second value, and the voltage detection circuit continues to provide the stop signal until the value of the output voltage is equal to or less than the first value; and a stopping step wherein the control circuit stops providing the voltage generating circuit with the driving signals upon receipt of the stop signal.

A second voltage generating device according to the present invention which can attain the above object comprises: the above-described first voltage generating circuit according to the present invention; a control circuit for supplying to the voltage generating circuit driving signals for firstly placing the first switch and the second switch in the OFF state, grounding the first terminal, and providing the second terminal with the supply voltage, then secondly providing the first terminal with the supply voltage, placing the second switch in the ON state, then thirdly placing the first switch and the second switch in the ON and OFF states respectively, grounding the second terminal, and then fourthly providing the second terminal with the supply voltage; and a voltage detection circuit for detecting an output voltage at the output terminal; wherein the voltage detection circuit provides a predetermined signal when the value of the detected output voltage is equal to or less than a predetermined value; wherein in the state that the control circuit provides driving signals for supplying the first terminal and the second terminal with the supply voltage and supplying such voltages that the first switch is placed in the ON state and the second switch is placed in the OFF state, when the control circuit receives the predetermined signal, the control circuit provides driving signals for grounding the first terminal, supplying the supply voltage to the second terminal, and supplying such voltages that the first switch and the second switch are placed in the OFF state.

A third voltage generating device according to the present invention which can attain the above object comprises: the above-described first voltage generating circuit according to the present invention; a second voltage generating circuit configured to comprise a fourth capacitor, a fifth capacitor which is a ferroelectric capacitor connected in series to the fourth capacitor, a sixth capacitor for grounding the output terminal, a third switch for connecting a second connecting node between the fourth capacitor and the fifth capacitor to the supply voltage supplying terminal, and a fourth switch for connecting the second connecting node to the output terminal; a first control circuit for providing the first voltage generating circuit with first driving signals for firstly placing the first switch and the second switch in the OFF state, grounding the first terminal, and providing the second terminal with the supply voltage, and then secondly providing the first terminal with the supply voltage and placing the second switch in the ON state, and then thirdly placing the first switch and the second switch in the ON and OFF states respectively and grounding the second terminal, and then fourthly providing the second terminal with the supply voltage; a second control circuit for providing the second voltage generating circuit with second driving signals for firstly placing the third switch and the fourth switch in the OFF state, grounding a third terminal of the fourth capacitor opposed to the second connecting node and providing a fourth terminal of the fifth capacitor opposed to the second connecting node with the supply voltage, then secondly providing the third terminal with the supply voltage and placing the fourth switch in the ON state, then thirdly placing the third switch and the fourth switch in the ON and OFF states respectively and grounding the fourth terminal, and then fourthly providing the fourth terminal with the supply voltage; and a voltage detection circuit for detecting an output voltage at the output terminal; wherein an output timing of the first driving signals is shifted from an output timing of the second driving signals by a half cycle; wherein the voltage detection circuit provides the first control circuit and the second control circuit with a control signal in response to the detected output voltage; wherein the first control circuit provides or stops providing the first driving signals in response to the control signal; and wherein the second control circuit provides or stops providing the second driving signals in response to the control signal.

A second method for driving a voltage generating device according to the present invention which can attain the above object is a method for driving the above-described third voltage generating device according to the present invention, and comprises: a detecting step wherein the voltage detection circuit detects an output voltage at the output terminal; an enabling step wherein the voltage detection circuit provides an enabling signal so that the first control circuit and the second control circuit can provide the first driving signals and the second driving signals respectively when the value of the detected output voltage is equal to or less than a first value, and the voltage detection circuit continues to provide the enabling signal until the value of the output voltage is equal to or more than a second value; a disabling step wherein the voltage detecting circuit provides a stop signal so that the first control circuit and the second control circuit can stop providing the first driving signals and the second driving signals respectively when the value of the output voltage is equal to or more than the second value, and the voltage detection circuit continues to provide the stop signal until the value of the output voltage is equal to or less than the first value; a first driving step wherein the first control circuit provides the first voltage generating circuit with the first driving signals upon receipt of the enabling signal; a first stopping step wherein the first control circuit stops providing the first voltage generating circuit with the first driving signals upon receipt of the stop signal; a second driving step wherein the second control circuit provides the second voltage generating circuit with the second driving signals, at a timing shifted by a half cycle from the output timing of the first driving signals, upon receipt of the enabling signal; and a second stopping step wherein the second control circuit stops providing the second voltage generating circuit with the second driving signals upon receipt of the stop signal.

A first semiconductor device according to the present invention which can attain the above object comprises: a voltage generating device comprising the above-described first voltage generating circuit according to the present invention, a first pass transistor, and a fifth transistor which connects an output terminal of the voltage generating device to a first gate of the first pass transistor; wherein when the fifth switch is placed in the ON state, a voltage is applied to the first gate from the output terminal of the voltage generating device so that the first pass transistor is placed in the ON state to output an input signal as an output signal.

A second semiconductor device according to the present invention which can attain the above object comprises: a memory cell, a sixth switch, and a voltage generating device comprising the above-described first voltage generating circuit according to the present invention which is connected to a word line of the memory cell via the sixth switch; wherein the sixth switch is placed in the ON state during the read period of the memory cell.

A third semiconductor device according to the present invention which can attain the above object comprises: a voltage generating device comprising the above-described first voltage generating circuit according to the present invention, a logic circuit comprising an MIS transistor, a high-threshold n-channel MISFET connecting the logic circuit to a predetermined voltage and having a threshold voltage larger than that of the MIS transistor, and a seventh switch for connecting a gate of the high-threshold n-channel MISFET to the voltage generating device; wherein the seventh switch is placed in the ON state while the logic circuit is in operation and in the OFF state while the logic circuit is on standby.

A fourth semiconductor device according to the present invention which can attain the above object comprises: a voltage generating device comprising the above-described first voltage generating circuit according to the present invention, a logic circuit comprising an MIS transistor, a high-threshold p-channel MISFET connecting the logic circuit to a predetermined voltage and having a threshold voltage larger than that of the MIS transistor, and an eighth switch for connecting a gate of the high-threshold p-channel MISFET to the voltage generating device; wherein the eighth switch is placed in the ON state while the logic circuit is on standby and in the OFF state while the logic circuit is in operation.

A first method for driving a semiconductor device according to the present invention which can attain the above object is a method for driving the above-described third semiconductor device according to the present invention, and comprises: an operating step wherein while the logic circuit is in operation, the seventh switch is placed in the ON state and a high voltage is supplied by the voltage generating device to the gate of the high-threshold n-channel MISFET; and a standby step wherein while the logic circuit is on standby, the seventh switch is placed in the OFF state and a voltage lower than the threshold voltage of the high-threshold n channel MISFET is supplied to the gate of the high-threshold n-channel MISFET.

A second method for driving a semiconductor device according to the present invention which can attain the above object is a method for driving the above-described fourth semiconductor device according to the present invention, and comprises: a standby step wherein while the logic circuit is on standby, the eighth switch is placed in the ON state and a high voltage is supplied by the voltage generating device to the gate of the high-threshold p-channel MISFET; and an operating step wherein while the logic circuit is in operation, the eighth switch is placed in the OFF state and a voltage lower than the threshold voltage of the high-threshold p-channel MISFET is supplied to the gate of the high-threshold p-channel MISFET.

BRIEF DESCRIPTION OF THE SEVERAL VIEWS OF THE DRAWING

FIG. 2(a) is a circuit diagram in which a ferroelectric capacitor and a paraelectric capacitor are connected in series. FIG. 2(b) shows the hysteresis characteristics of the ferroelectric capacitor.

DETAILED DESCRIPTION OF THE INVENTION (FIRST EMBODIMENT)

Configuration of Voltage Generating Circuit

Figure 1:
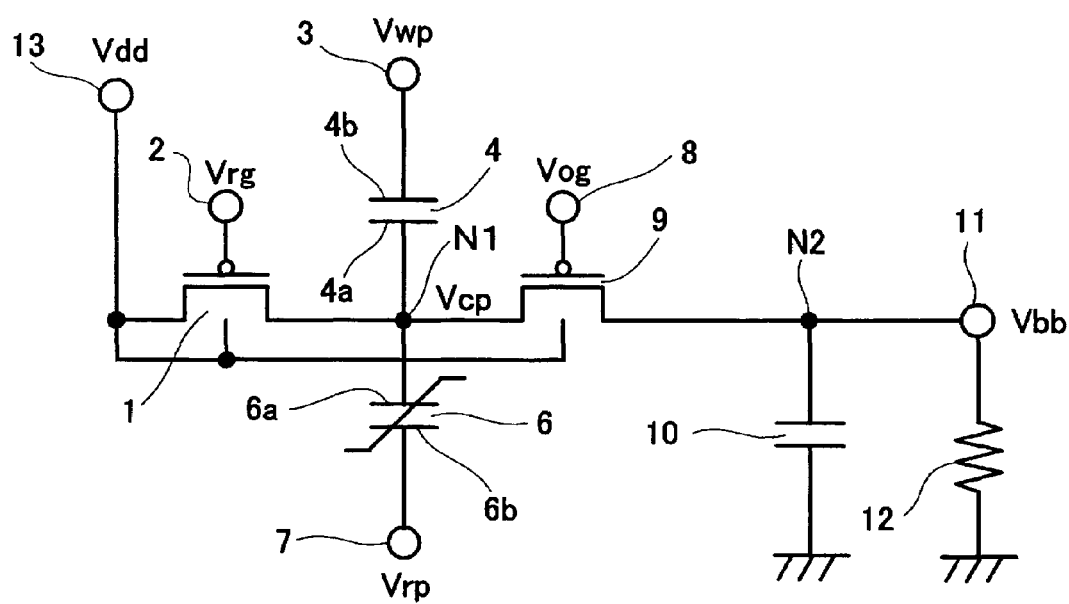
FIG. 1 is a circuit diagram of the voltage generating circuit according to a first embodiment of the present invention.

FIG. 1 is a circuit diagram schematically showing the configuration of the voltage generating circuit according to the first embodiment of the present invention. As shown in FIG. 1, the voltage generating circuit according to this embodiment has a first capacitor 4 and a second capacitor 6. The first capacitor 4 is a paraelectric capacitor having a paraelectric film and two electrodes, 4a and 4b. The paraelectric film is sandwiched between the two electrodes 4a and 4b. The second capacitor 6 is a ferroelectric capacitor having a ferroelectric film and two electrodes, 6a and 6b. The ferroelectric film is sandwiched between the two electrodes 6a and 6b. The electrode 4a of the paraelectric capacitor 4 is connected to the electrode 6a of the ferroelectric capacitor 6 by a connecting node N1. The other electrode of the paraelectric capacitor 4, i.e., the electrode 4b, is connected to a write terminal 3. The other electrode of the ferroelectric capacitor 6, i.e., the electrode 6b, is connected to a reset terminal 7.

This voltage generating circuit also has a first switch (reset control transistor) 1 and second switch (output control transistor) 9 which are p-channel MISFETs. The first and second switches are connected serially via the connecting node N1 placed therebetween. The gate of the reset control transistor 1 is connected to a reset control terminal 2, while the gate of the output control transistor 9 is connected to an output control terminal 8. The circuit also has a configuration such that a supply voltage Vdd is applied to the source of the reset control transistor 1 via a supply voltage supplying terminal 13, and an output voltage Vbb is outputted from an output node N2 connected to the drain of the output control transistor 9 via an output terminal 11. The supply voltage supplying terminal 13 is connected to the substrate regions of the reset control transistor 1 and output control transistor 9. The substrate voltages of transistors 1 and 9 are nearly equal to the supply voltage Vdd. This is to prevent the pn junctions formed between the substrate and the source/drain regions from being forward-biased.

A load capacitor 10 is connected between the ground and an output node N2, which is connected to the drain of the output control transistor 9. The output terminal 11 is connected to a load resistance 12, which represents an object to which the output voltage of this voltage generating circuit is applied.

As described below, a predetermined voltage is applied to this voltage generating circuit by the terminals 2, 3, 7 and 8 at predetermined times, and the circuit outputs a predetermined voltage Vbb from the output terminal 11.

Although in this embodiment the first capacitor 4 is a paraelectric capacitor, both the first and second capacitors 4 and 6 may be ferroelectric capacitors.

For example, a ferroelectric capacitor 6 comprising strontium bismuth tantalate ($SrBi_2Ta_2O_9$; also called Y1) with an area of 500 $\mu m^2$ and a paraelectric capacitor 4 with a capacitance value of 100 pF are used for this embodiment. The operation of the voltage generating circuit of FIG. 1 will be described below. Electrical characteristics of the ferroelectric capacitor 6 will be described later in detail. Here, the outline of the operation will be described.

Outline of Operation of Voltage Generating Circuit

While on standby, the supply voltage Vdd is applied to the write terminal 3, reset terminal 7, reset control terminal 2 and output control terminal 8. In this state, the reset control transistor 1 and output control transistor 9 are both in the OFF state. The voltage generating circuit is turned into an operative state by applying a pulse-like ground voltage, i.e., 0 V, to the terminals 2, 3, 7 and 8 at predetermined times. The operating state of this voltage generating circuit can be divided into the following four periods:

(1) First Period (Write Period)

While applying the supply voltage Vdd to the reset terminal 7, the ground voltage 0 V is applied as the voltage Vwp of the write terminal 3 to induce polarization in the ferroelectric capacitor 6. In this first period, both the reset control transistor 1 and output control transistor 9 are in the OFF state. This polarized state, i.e., the state in which a positive charge is induced in the electrode 6b of the ferroelectric capacitor 6 and a negative charge is induced in the electrode 6a, is defined as "positive polarization". This first period is denoted as the write period.

(2) Second Period (Output Period)

Subsequently, a voltage equal to the voltage Vrp of the reset terminal 7, i.e., the supply voltage Vdd, is applied to the write terminal 3. Then, the voltage of the connecting node N1 increases to the sum of the voltage induced by polarization of the ferroelectric capacitor 6 and the supply voltage Vdd. Thereafter, the ground voltage 0 V is applied to the output control terminal 8, and the output control transistor 9, which is a p-channel MISFET, is turned on. Thus, the voltage which has been increased and maintained at the connecting node N1 is outputted from the output terminal 11. In this second period, the reset control transistor 1 is still in the OFF state. In this second period, the voltage which is the sum of the voltage caused by the polarization of the ferroelectric capacitor 6 and the supply voltage Vdd is outputted. Therefore, this second period is denoted as the output period. In this embodiment, a load capacitor 10 with a capacitance value of 100 pF and a load resistance 12 with a resistance value of 1 MΩ are connected to the output node N2 as load.

(3) Third Period (Reverse Period)

In the above-described output period, when a load current flows from the output node N2 to the connecting node N1, electrons are accumulated in the connecting node N1, and the polarization of the ferroelectric capacitor 6 becomes unstable, lowering the output voltage. To prevent such a lowered output, the polarization of the ferroelectric capacitor 6 is reversed in the opposite direction to the positive polarization of the write period to provide a period for drawing out the electrons accumulated in the connecting node N1.

First, the voltage applied to the output control terminal 8 is returned to the supply voltage Vdd, and at the same time, the output control transistor 9 is returned to the OFF state, the ground voltage 0 V is applied to the reset control terminal 2, and the reset control transistor 1, which is a p-channel MISFET, is turned ON to make the voltage of the connecting node N1 at the supply voltage Vdd. Second, the ground voltage 0 V is applied to the reset terminal 7. This causes the supply voltage Vdd to be applied to the electrode 6a of the ferroelectric capacitor 6, and the ground voltage 0 V to be applied to the electrode 6b. Accordingly, the polarization of the ferroelectric capacitor 6 is reversed in the direction opposite to the positive polarization of the write period. The polarization state of the ferroelectric capacitor 6 is reset by this operation. This third period is denoted as the reverse period.

(4) Fourth Period (Charge Withdrawing Period)

While the reset control transistor 1 in the ON state, i.e., maintaining the voltage of the connecting node N1 at the supply voltage Vdd, the supply voltage Vdd is applied to the reset terminal 7. This shorts the electrodes 6a and 6b of the ferroelectric capacitor 6, allowing the electrons accumulated in the connecting node N1 to be drawn out. This fourth period is denoted as the charge withdrawing period. The charge withdrawing period and the reverse period described above together form the reset period.

Figure 2:
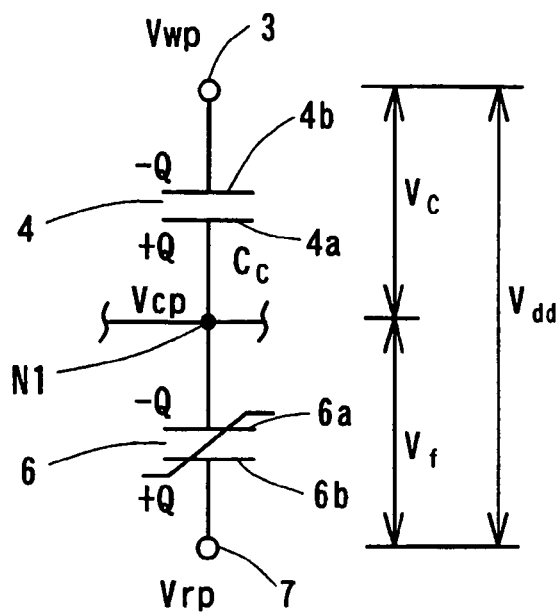
FIG. 2 is a drawing illustrating the operation of the voltage generating circuit of FIG. 1.
Figure 2:
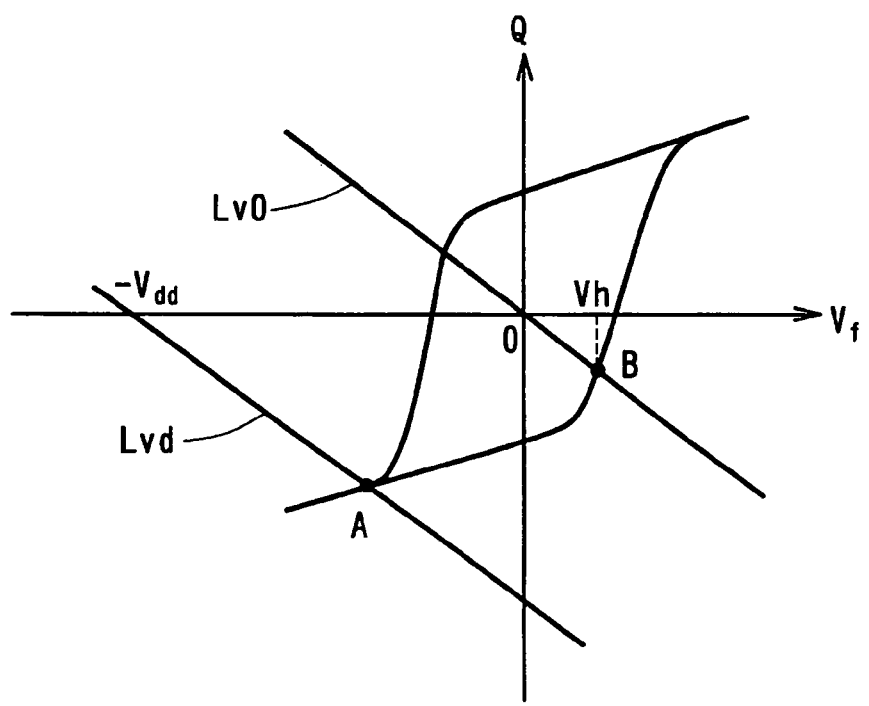

Relationship Between the Polarization and Voltage of Capacitors Connected in Series FIG. 2(a) is a partial circuit diagram showing the serially connected ferroelectric capacitor 6 and paraelectric capacitor 4 of FIG. 1. FIG. 2(b) shows the hysteresis characteristics of the ferroelectric capacitor 6.

As shown in FIG. 2(a), in this embodiment, the ferroelectric capacitor 6 and paraelectric capacitor 4, whose capacitance value is Cc, are connected serially. Now, assume that the ground voltage 0 V is applied to the write terminal 3 connected to the electrode 4b of the paraelectric capacitor 4, and the positive supply voltage Vdd is applied to the reset terminal 7 connected to the electrode 6b of the ferroelectric capacitor 6. At this time, the voltage Vdd between the write terminal 3 and reset terminal 7 is distributed to the capacitors 4 and 6. When Vf and Vc indicate respectively the voltages applied to the ferroelectric capacitor 6 and the paraelectric capacitor 4, the relationship expressed by formula (1) is valid:

$$Vdd = Vf + Vc \quad (1)$$

Further, assume that the amount of electric charge induced by the polarization of the ferroelectric capacitor 6 is Q. That is, assume that a positive electric charge +Q is induced in the electrode 6b of the ferroelectric capacitor 6, while a negative electric charge −Q is induced in the electrode 6a. The total charge at the connecting node N1 between the ferroelectric capacitor 6 and paraelectric capacitor 4 is 0, according to the charge conservation law. Accordingly, the electric charge +Q is induced in the electrode 4a of the paraelectric capacitor 4, and the electric charge −Q is induced in the electrode 4b. Therefore, the relationship expressed by formula (2) is valid:

$$Q = Cc \cdot Vc \quad (2)$$

Formula (3) is derived from formula (1) and formula (2):

$$Q = Cc \cdot (Vdd - Vf) \quad (3)$$

FIG. 2(b) shows the straight line expressed by formula (3) over the hysteresis curve showing the polarization of the ferroelectric capacitor 6. In FIG. 2(b), the intersection A of the hysteresis curve and the straight line Lvd expressed by formula (3) represents the voltage and the amount of electric charge of the ferroelectric capacitor 6. Herein, the voltage is expressed on the basis of the potential of the reset terminal 7. That is, since the potential of the terminal 3 is lower than that of the reset terminal 7, the potential of the electrode 6a is lower (Vf<0) than that of the electrode 6b in the ferroelectric capacitor 6.

As described above, when the negative voltage −Vdd is applied (the potential of the write terminal 3 is 0 V, and the potential of the reset terminal 7 is Vdd) between the write terminal 3 and reset terminals 7, and then the potential of the write terminal 3 is set to Vdd and the voltage between these terminals is returned to 0 V, the intersection B of the straight line Lv0 and hysteresis curve represents the polarization of the ferroelectric capacitor 6. At this time, the potential of the electrode 6a in the ferroelectric capacitor 6 is higher than that of the electrode 6b, and the voltage Vf between these electrodes is Vh (see FIG. 2(b)). That is, the potential of the connecting node N1 is higher than that of the reset terminal 7 by Vh. Consequently, when the supply voltage Vdd is applied to the write terminal 3, the output voltage will be Vdd+Vh, obtaining a voltage higher than the input voltage (supply voltage Vdd), i.e., a raised voltage.

Operation Example

Figure 3:
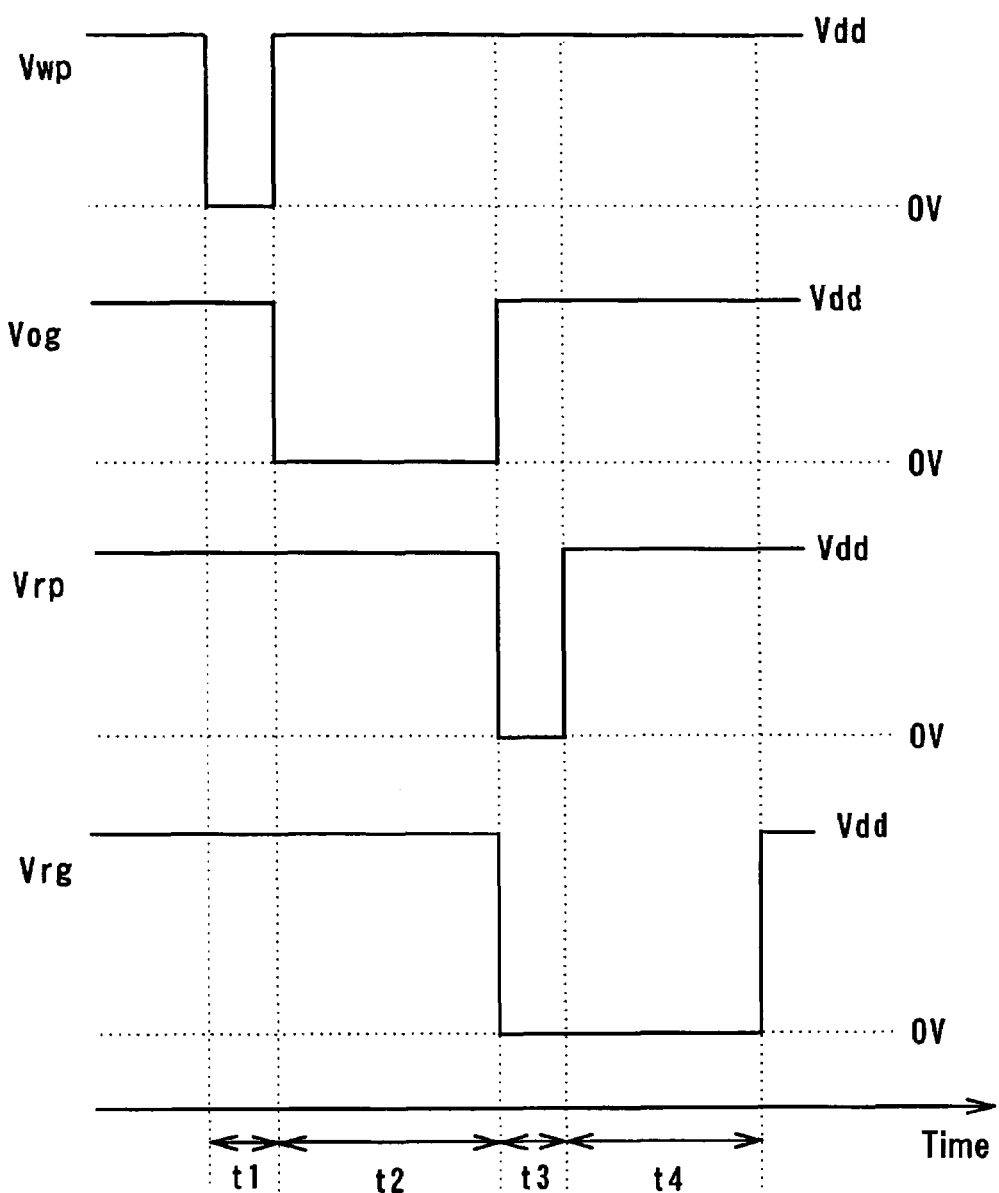
FIG. 3 is a time chart showing the change over time of the voltage applied to each terminal of the voltage generating circuit shown in FIG. 1.
Figure 4:
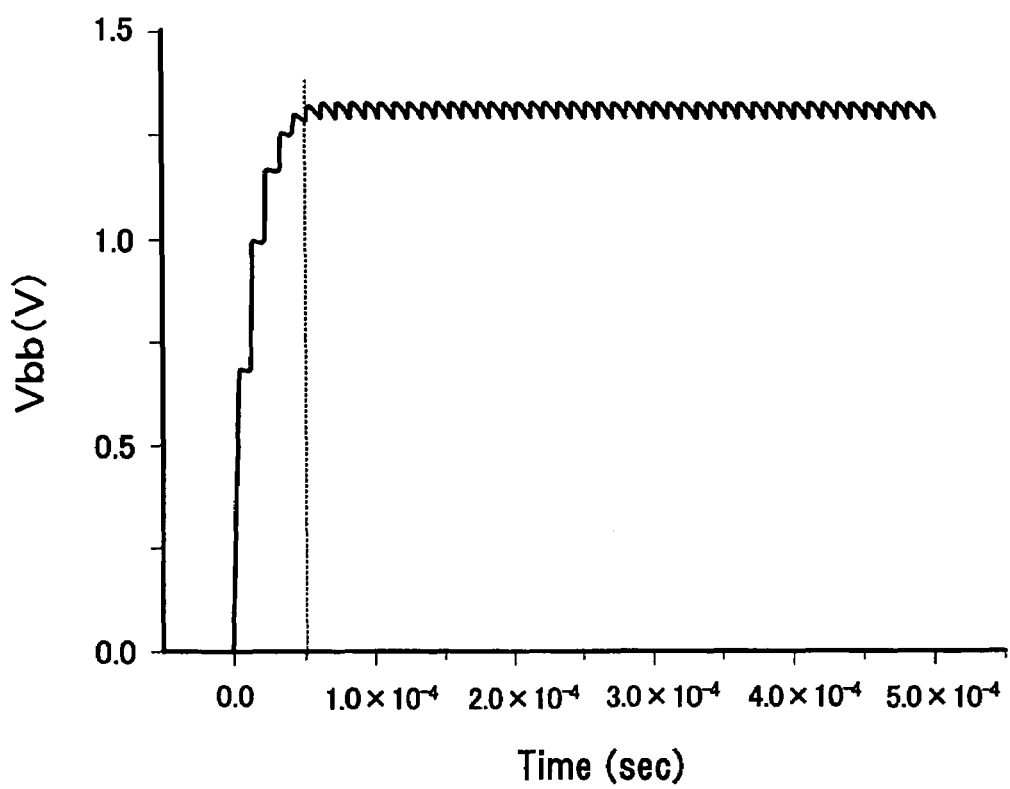
FIG. 4 shows the rising characteristic of the output voltage of the voltage generating circuit of FIG. 1.
Figure 5:
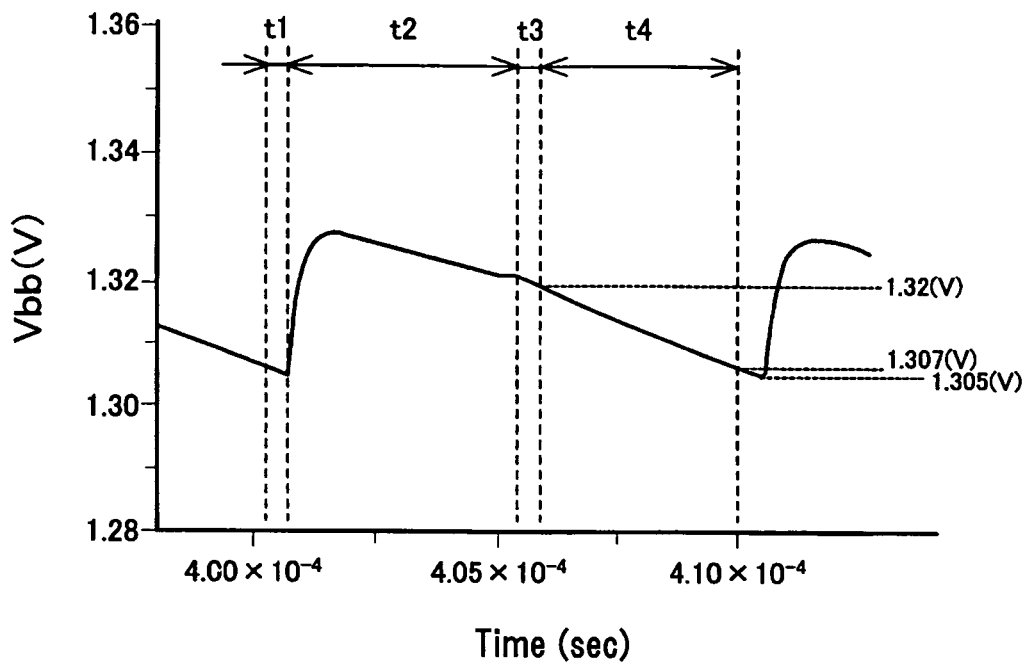
FIGS. 5(a) and 5(b) show the change over time in the output voltage and the voltage of the connecting node of the voltage generating circuit of FIG. 1, respectively.
Figure 5:
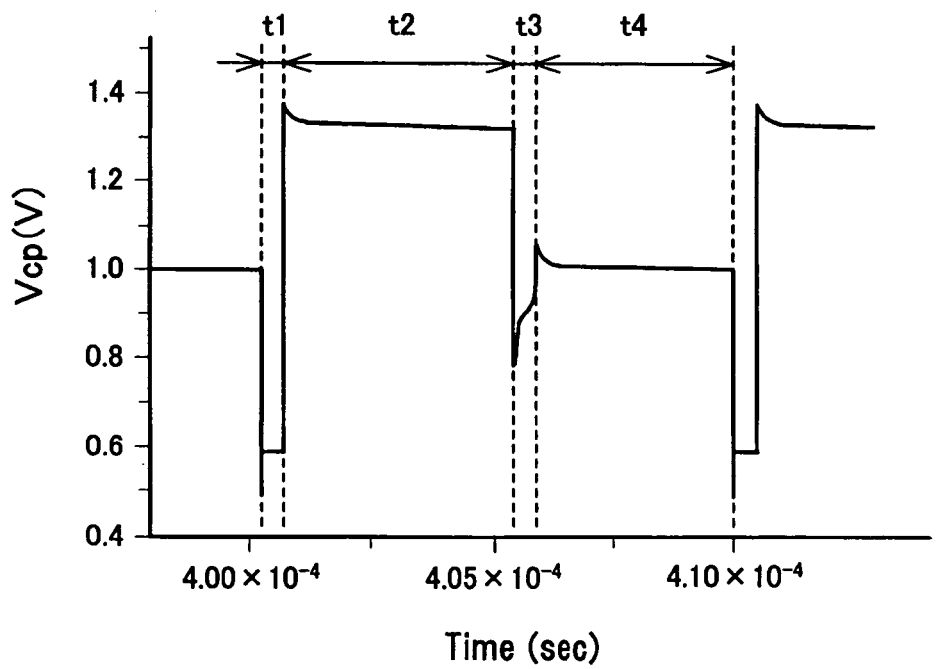

FIG. 3 is a time chart showing the change over time of the voltage applied to each terminal of the voltage generating circuit according to this first embodiment. FIG. 4 shows the rising characteristics of the output voltage Vbb outputted from the output terminal 11. FIGS. 5(a) and 5(b) are time charts which show the change of the output voltage Vbb and the voltage Vcp of the connecting node N1, respectively, in the voltage generating circuit according to this embodiment over the first through fourth periods. In FIGS. 3 and 5, t1 to t4 correspond to the first to fourth periods described above respectively. Examples of the operation of the voltage generating circuit according to this embodiment will be described below with reference to FIGS. 3–5.

While on standby, as shown in FIG. 3, the voltages Vwp, Vog, Vrp, and Vrg of the write terminal 3, output control terminal 8, reset terminal 7 and reset control terminal 2 respectively, are set to the supply voltage Vdd, for example, 1 V.

(1) Write Period

As shown in FIG. 3, in the write period t1, only the voltage Vwp of the write terminal 3 is set to the ground voltage (0 V in this example). This state is maintained for about 0.45 μsec. In this period, as shown during period t1 in FIG. 5(b), the voltage Vcp of the connecting node N1 is about 0.6 V, and the ferroelectric capacitor 6 is in the positive polarization. However, in this period, since the voltage of the output control terminal 8 is Vdd and the output control transistor 9 is in the OFF state, the voltage of the connecting node N1 is not outputted to the output terminal 11. In this write period, the voltage of the reset control terminal 2 is also Vdd, and the reset control transistor 1 is also in the OFF state.

(2) Output Period

In the output period t2, the voltage Vwp of the write terminal 3 is set to the same voltage as the voltage Vrp of the reset terminal 7, i.e., the supply voltage Vdd, and the voltage of the connecting node N1 is raised to the total voltage value of the voltage caused by the polarization of the ferroelectric capacitor 6 and the supply voltage Vdd. In this example, the voltage Vcp of the connecting node N1 is about 1.3 V (see period t2 in FIG. 5($b$)). The voltage Vog of the output control terminal 8 is set to the ground voltage (0 V), and this state is maintained for about 4.5 μsec. By this operation, the output control transistor 9 is turned on and the raised voltage maintained at the connecting node N1 is outputted from the output terminal 11 via the output node N2. In this output period, the voltage of the reset control terminal 2 is Vdd, and the reset control transistor 1 is kept in the OFF state.

(3) Reverse Period

In the reverse period t3, the voltage applied to the output control terminal 8 is returned to the supply voltage Vdd to turn off the output control transistor 9, and at the same time the voltage Vrp of the reset terminal 7 and the voltage Vrg of the reset control terminal 2 are set to the ground voltage (0 V). This state is maintained for about 0.45 μsec. At this time, the reset control transistor 1 is turned on, the voltage Vcp of the connecting node N1 becomes the supply voltage Vdd, and the voltage Vrp of the reset terminal 7 is set to the ground voltage (0 V). Accordingly, the voltage opposite to that in the write period t1 is applied to the ferroelectric capacitor 6, and the polarization of the ferroelectric capacitor 6 is reversed in the direction opposite to that in the write period.

(4) Charge Withdrawing Period

In the charge withdrawing period t4, while maintaining the voltage Vrg of the reset control terminal 2 at the ground voltage (0 V), and the reset control transistor 1 in the ON state, that is, while maintaining the voltage Vcp of the connecting node N1 at the supply voltage Vdd, the voltage Vrp of the reset terminal 7 is changed from 0 V to the supply voltage Vdd. This state is maintained for about 4.5 μsec. This operation causes the electrodes 6$a$ and 6$b$ of the ferroelectric capacitor 6 to be shorted, and thus the electron accumulated in the connecting node N1 are drawn out.

Suppose that the above-described periods, i.e., write period t1, output period t2, reverse period t3 and charge withdrawing period t4, form a cycle, then the voltage is repeatedly applied to each terminal in each period. Thus a raised voltage can be applied to the output terminal 11 continuously and stably.

By applying the voltage to each terminal of the voltage generating circuit as shown in the time chart of FIG. 3, a stable output voltage Vbb of the output node N2, i.e., the output terminal 11, was obtained about 50 μsec after the output control transistor 9 was turned on, as shown in FIG. 4. At that time, the voltage was about 1.3 V.

The output node N2 is electrically disconnected from the connecting node N1 in the write period t1. Therefore, as shown in FIG. 5($a$), the output voltage Vbb of the output node N2, i.e., the output terminal 11, is lowered to about 1.31 V in the write period t1. However, when the output period t2 starts, a raised voltage is supplied from the connecting node N1, and hence the output voltage Vbb recovers to about 1.33 V. In the reverse period t3 and charge withdrawing period t4, the voltage Vbb of the output node N2 decreases essentially monotonously from about 1.33 V to about 1.31 V. Therefore, ripple (variation in voltage) is as low as about 0.02 V, and the output voltage Vbb remains stable.

In the write period t1, the ground voltage is applied to the write terminal 3. For this reason, as shown in FIG. 5($b$), the voltage Vcp of the connecting node N1 will be about 0.6 V. In the output period t2, the raised voltage of about 1.3 V is maintained at the connecting node N1. In the reverse period t3, since the polarization direction of the ferroelectric capacitor 6 is reversed, the voltage Vcp of the connecting node N1 will be about 0.9 V. In the subsequent charge withdrawing period t4, the electrodes 6$a$ and 6$b$ of the ferroelectric capacitor 6 are shorted, and therefore the voltage Vcp of the connecting node N1 will be about 1 V.

Thus, the voltage generating circuit according to this embodiment generates a raised voltage by using the polarization inversion of the ferroelectric capacitor 6. This enables stable maintenance of the raised voltage at the connecting portion (connecting node N1) of the ferroelectric capacitor 6 and paraelectric capacitor 4, and continuous output of the raised voltage from the output terminal 11.

In the embodiment described above, the ferroelectric capacitor 6 comprises Y1 but the material is not limited to this, and any other material that has suitable hysteresis characteristics for the relationship between the voltage between electrodes and electric charge induced by the voltage may provide similar operating characteristics. Examples include ferroelectric lead zirconate titanate ($Pb(Zr_{0.45}Ti_{0.55})O_3$; PZT) and high molecular weight compounds such as polyvinylidene fluoride-ethylene trifluoride copolymer (P(VDF/TrFE)).

(Second Embodiment)

Figure 6:
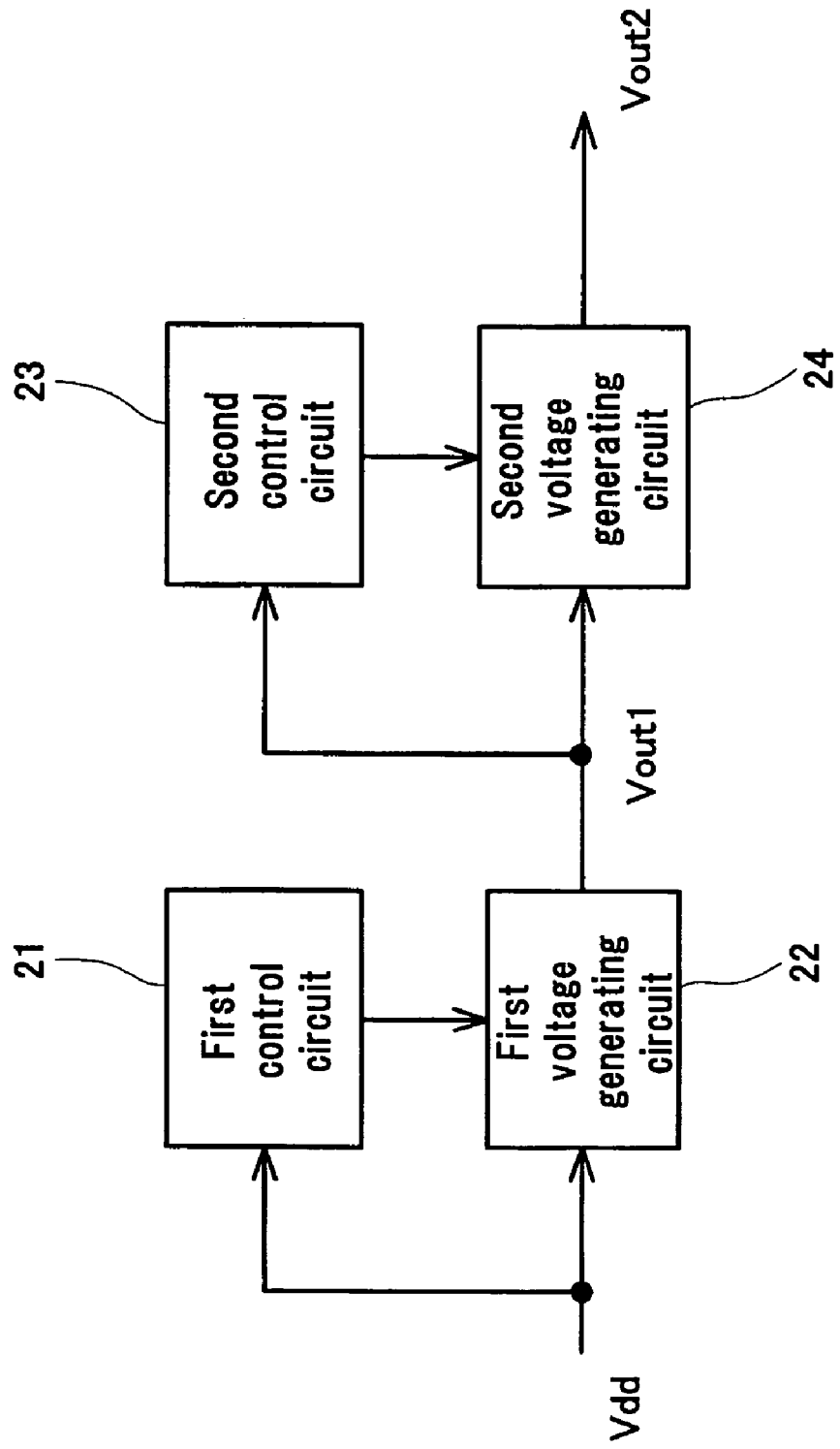
FIG. 6 is a block diagram showing the configuration of a voltage generating device according to a second embodiment of the present invention.

FIG. 6 is a block diagram schematically showing the configuration of the voltage generating device according to the second embodiment of the present invention. This voltage generating device comprises a first control circuit 21, first voltage generating circuit 22, second control circuit 23 and second voltage generating circuit 24. Herein, the first and second voltage generating circuits 22 and 24 have the voltage raising function described in the first embodiment. The voltage generating device according to this embodiment is configured with the two voltage generating circuits 22 and 24 connected serially. The first control circuit 21 controls the voltages applied to the terminals 2, 3, 7 and 8 of the first generating circuit 22 and the second control circuit 23 controls the voltages applied to the terminals 2, 3, 7 and 8 of the second generating circuit 24, as described in the first embodiment (see FIGS. 1 and 3). The first voltage generating circuit 22, in the first step, raises the supply voltage Vdd and outputs it as a first output voltage Vout out1. The second voltage generating circuit 24, in the second step, outputs a second output voltage Vout2 that has been further raised from the first output voltage Vout1.

In the case described above, two voltage generating circuits 22 and 24 are connected serially. However, three or more voltage generating circuits may be connected serially. In addition, two or more voltage generating circuits may be controlled by a single control circuit.

Thus, connecting two or more voltage generating circuits serially facilitates generating a voltage which has been raised from the supply voltage Vdd by a desired voltage value.

(Third Embodiment)

Figure 7:
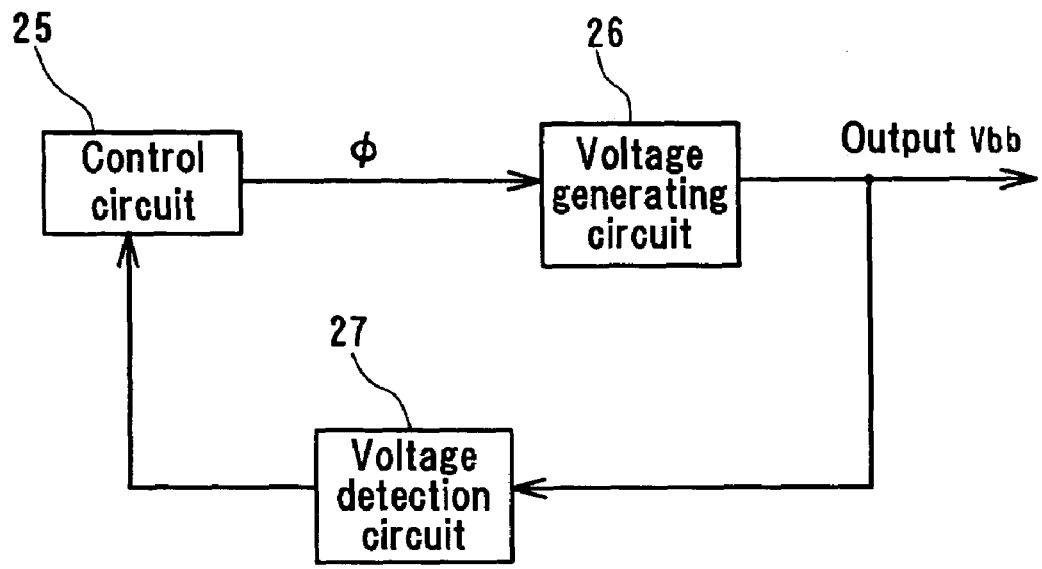
FIG. 7(a) is a block diagram showing the configuration of a voltage generating device according to a third embodiment of the present invention.
FIG. 7(b) is an explanatory drawing showing the relationship between the change over time in the output voltage of the voltage generating device and the operation of its control circuit.
Figure 7:
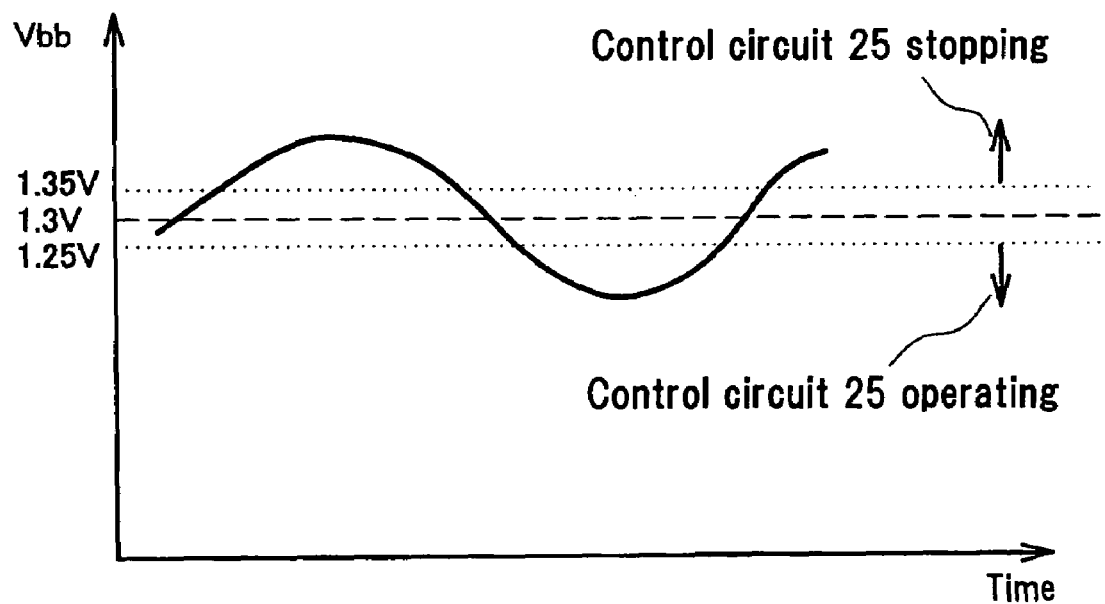

FIG. 7(a) is a block diagram schematically showing the configuration of a voltage generating device according to the third embodiment of the present invention. FIG. 7(b) shows the change over time of the output voltage. As shown in FIG. 7(a), the voltage generating device according to this embodiment comprises a voltage generating circuit 26 having the voltage raising function described in the first embodiment, a control circuit 25 for controlling the operation of the voltage generating circuit 26 and a voltage detection circuit 27 for detecting an output voltage Vbb outputted from the voltage generating circuit 26.

The control circuit 25 controls the voltages applied to the terminals 2, 3, 7 and 8, as described in the first embodiment (see FIGS. 1 and 3). The signal symbol φ shown in FIG. 7(a) represents the voltages Vrg, Vwp, Vrp and Vog applied to terminals 2, 3, 7 and 8 of the voltage generating circuit 26 respectively. The control circuit 25 changes its operating state in response to the signal inputted from the voltage detecting circuit 27, as described below.

Described first is the case where the control circuit 25 operates or stops in response to the output signal from the voltage detecting circuit 27. Assume that a first predetermined value V1 and second predetermined value V2 have the relationship: 0<V1<V2. The voltage detection circuit 27 detects the output voltage Vbb of the voltage generating circuit 26; outputs a signal for operating the control circuit 25 if Vbb is not higher than V1; maintains this state until Vbb becomes not lower than V2; outputs a signal for stopping the control circuit 25 if Vbb becomes not lower than V2; and maintains that state until Vbb becomes not higher than V1 again.

Specifically, assuming that the first predetermined value V1=1.25(V) and second predetermined value V2=1.35(V), when the output voltage Vbb of the voltage generating circuit 26 reaches the state of Vbb≧1.35 after the state of 1.25<Vbb<1.35 in which the control circuit 25 is in operation, the voltage detection circuit 27 outputs a signal for stopping the control circuit 25, as shown in FIG. 7(b). The voltage detection circuit 27 then keeps outputting the signal for stopping the control circuit 25 until Vbb falls so that Vbb≦1.25, and when Vbb≦1.25, the voltage detection circuit 27 outputs a signal for operating the control circuit 25. The voltage detection circuit 27 keeps outputting the signal for operating the control circuit 25 until Vbb rises so that Vbb≧1.35, and when Vbb≧1.35, the voltage detection circuit 27 outputs the signal for stopping the control circuit 25.

A differential of 0.1 V is provided between the two operating threshold voltages V1 and V2 in order to keep the operation of the voltage generating device stable, but this value imposes no restrictions on the concept of the present invention. Namely, values other than 0.1 V may be used or only one threshold value may be used. For example, the voltage detection circuit 27 may detect the output voltage Vbb of the voltage generating circuit 26, provide a signal for operating the control circuit 25 when it is equal to or less than a predetermined threshold V3, and provide a signal for stopping the control circuit 25 when it exceeds the threshold V3.

Next, the situation in which the control circuit 25 changes the timing of supplying voltages to the voltage generating circuit 26 in response to an output signal from the voltage detection circuit 27 will be described below. In this situation, the voltage Vbb of at the output terminal 11 is observed and the timing of the control circuit 25 supplying control voltages to the voltage generating circuit 26 is adjusted so that the difference between minimum and maximum values (ripple) is minimized, since the voltage Vbb decreases to a minimum at the last moment within the write period t1 and increases to a maximum immediately after the succeeding read period t2 begins, as shown in FIG. 5(a). That is, the voltage detection circuit 27 detects the voltage Vbb outputted by the voltage generating circuit 26 and provides a signal to cause the control circuit 25 to terminate the charge withdrawing period t4 and to begin the write period t1 when Vbb is equal to or less than a predetermined value V4. For example, V4 may be set at a value within the value range that the output voltage Vbb can be in the charge withdrawing period t4 (approx. 1.307 V–approx. 1.32 V in FIG. 5(a)) and similar to the lower limit value (approx. 1.307 V). By setting V4 such a value, the output voltage Vbb decreases essentially monotonously, and when the voltage Vbb becomes equal to the predetermined value V4 before the end of the charge withdrawing period, the voltage detection circuit 27 detects this and outputs to the control circuit 25 a signal to terminate the charge withdrawing period t4 and initiate the write period t1. In response to this signal, the control circuit 25 provides the terminals of the voltage generating circuit 26 with the voltages corresponding to the write period t1, and then, the output period t2 begins after a predetermined period of time t1. Therefore, Vbb does not decrease to approximately 1.305 V (the minimum value during the write period t1 without the control described above) as shown in FIG. 5(a), and the minimum value of Vbb becomes slightly lower than V4. Thus, the ripple of the output voltage Vbb is reduced.

As described above, in this voltage generating device, a stable output voltage Vbb of the voltage generating circuit 26 as well as its reduced power consumption can be achieved by providing the voltage detection circuit 27 in addition to the voltage generating circuit 26 and control circuit 25. In this embodiment, in order to stabilize the output voltage Vbb, a differential between reference values for switching ON and OFF (difference between the threshold voltages V1 and V2) of 0.1 V is provided. The value of this differential can be suitably selected according to the type of the apparatus for which this voltage generating device is applied, etc. It is also possible to configure the voltage generating device of this embodiment by disposing serially connected components in a plurality of blocks as in the second embodiment. In that case, improved voltage raising function can be achieved, in addition to the effects of this embodiment.

(Fourth Embodiment)

Figure 8:
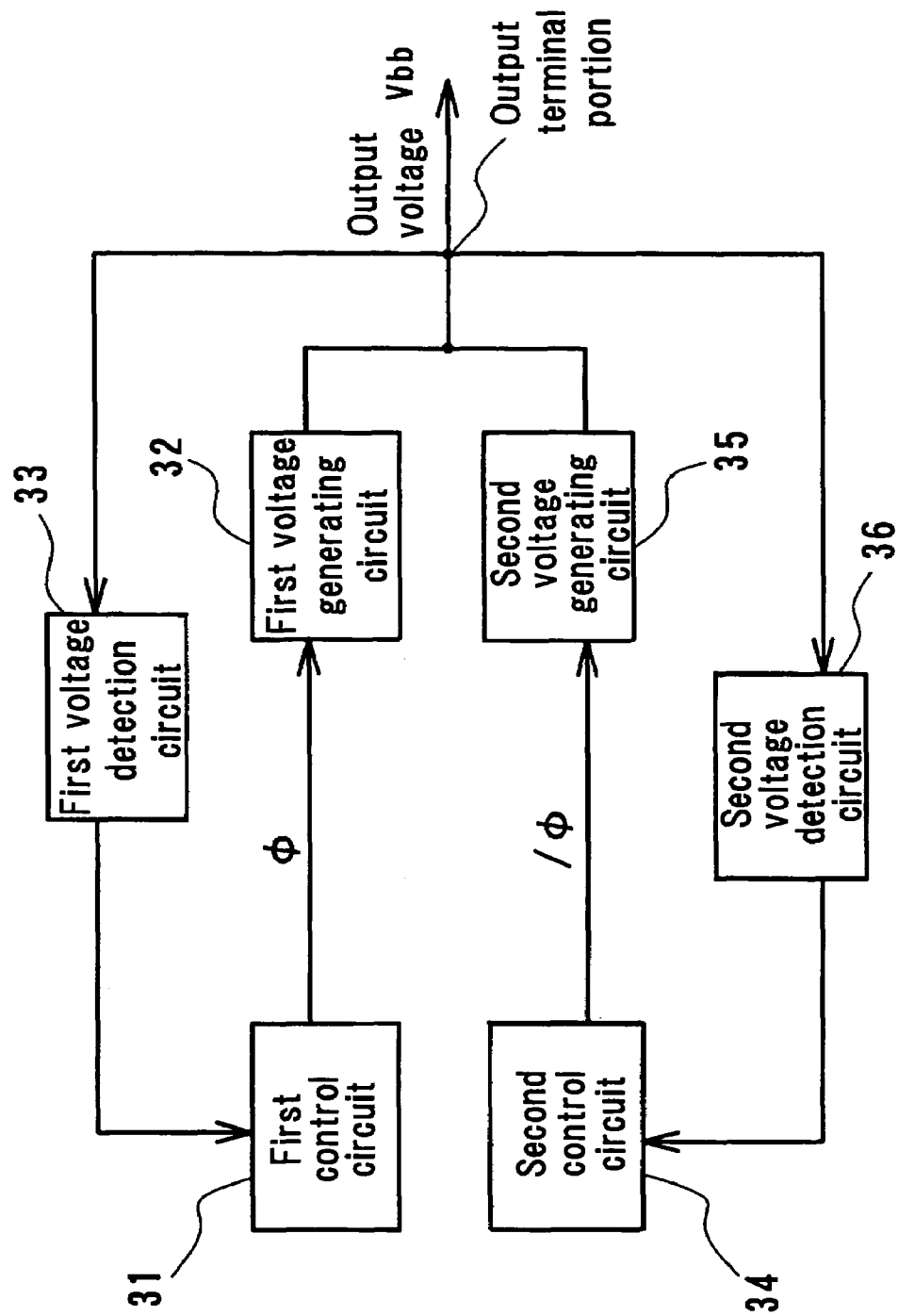
FIG. 8 is a block diagram showing the configuration of a voltage generating device according to a fourth embodiment of the present invention.

FIG. 8 is a block diagram schematically showing the configuration of a voltage generating device according to the fourth embodiment of the present invention. The voltage generating device according to this embodiment comprises first and second control circuits 31 and 34, first and second voltage generating circuits 32 and 35 having the voltage raising function described in the first embodiment, and first and second voltage detection circuits 33 and 36.

Herein, the operations of the first and second control circuits 31 and 34, and the first and second voltage detection circuits 33 and 36 differ from those of the control circuit 25 and voltage detection circuit 27 explained in the third embodiment in the following two ways:

The first difference is that two voltage generating devices according to the third embodiment are arranged in parallel, that is, the output terminals of these devices are arranged so that they are connected to a common output terminal portion to output an output voltage Vbb. The second difference is that the timings of signals φ and /φ for operating the first and second voltage generating circuits 32 and 35, corresponding to the first control circuit 31 and second control circuit 34 respectively, is shifted by a half cycle.

For example, the first control circuit 31 supplies to the first voltage generating circuit 32 voltages corresponding to the output period t2 during the first half cycle, and the second control circuit 34 supplies to the second voltage generating circuit 35 voltages corresponding to the output period t2 during the second half cycle. During the first half cycle in this example, the second voltage generating circuit 35 is not placed in a state corresponding to the output period t2 and the output control transistor 9 (see FIG. 1) is in the OFF state which causes the second voltage generating circuit 35 to be disconnected from the output terminal portion. During the second half cycle, the first voltage generating circuit 32 is not placed in a state corresponding to the output period t2, which causes the first voltage generating circuit 32 to be disconnected from the output terminal portion. Therefore, during the first half cycle, only the first voltage generating circuit 32 supplies a voltage to the output terminal portion, and during the second half cycle, only the second voltage generating circuit 35 supplies a voltage to the output terminal portion.

As a result of this, in the voltage generating device according to the third embodiment, a raised voltage is supplied from the connecting node N1 (see FIG. 1) to the output terminal only during the output period t2 (see FIG. 3), as described in the first embodiment. In contrast, in this embodiment, a raised voltage generated at the connecting node N1 (see FIG. 1) of the two voltage generating circuits 32 and 35 is alternately applied to the output terminal portion. Hence, the voltage generating circuits 32 and 35 can supply a raised voltage through the output terminal portion for a longer period as compared with the voltage generating device according to the third embodiment, thereby reducing the ripple (change in voltage) of the output voltage Vbb. In addition, since the two voltage generating circuits 32 and 35 are used to supply voltage, the load current can also be increased. For example, a stable output voltage with a similar time parameter to that as shown in FIG. 4 as well as a much smaller ripple than that shown in FIG. 4 can be provided by determining the capacitance values of the load capacitors for both the first voltage generating circuit 32 and second voltage generating circuit 35 to be half the capacitance value of the load capacitor 10 in FIG. 1 and shifting the operating cycle of the first voltage generating circuit 32 from that of the second voltage generating circuit 35 by a half cycle.

As described above, according to the voltage generating device of this embodiment, ripple can be reduced and load current can be increased by arranging two of the voltage generating devices according to the third embodiment in parallel and shifting the operating cycle of the first voltage generating circuit 32 from that of the second voltage generating circuit 35 by a half cycle.

It is also possible to configure the voltage generating device of this embodiment by disposing serially connected components in a plurality of blocks as in the second embodiment. In that case, an improved voltage raising function can be achieved in addition to the effects of this embodiment.

The voltage generating device according to this embodiment has been described above in terms of a circuit configuration having two voltage generating circuits 32 and 35; however, another voltage generating device according to a variant of this embodiment may have a single voltage detection circuit that provides output signals to the two control circuits 31 and 34. Alternatively, the device may omit either of the voltage detection circuits 33 or 36.

(Fifth Embodiment)

Figure 9:
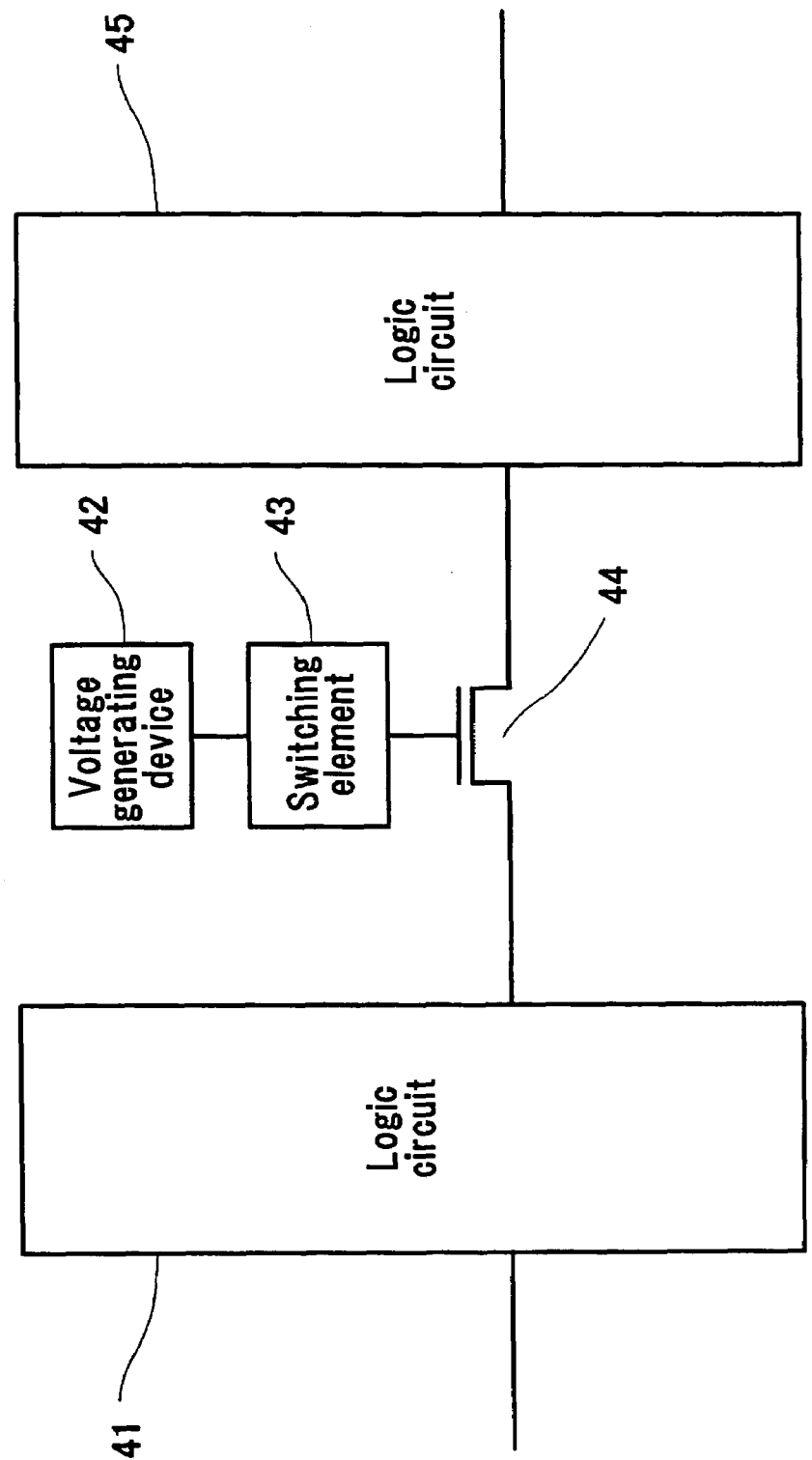
FIG. 9 is a block diagram showing the configuration of a semiconductor device according to a fifth embodiment of the present invention.

FIG. 9 is a block diagram schematically showing the configuration of a semiconductor device according to the fifth embodiment of the present invention. The semiconductor device according to this embodiment comprises a voltage generating device 42 provided with the voltage generating circuit of the present invention, a pass transistor 44 to which the output of the voltage generating device 42 is applied to its gate via a switching element 43, logic circuit 41 located on one side of the pass transistor 44, and logic circuit 45 located on the other side of the pass transistor 44.

A feature of the semiconductor device according to this embodiment is that it prevents a voltage drop of the logic signal outputted from the logic circuit 41 by applying a raised voltage to the gate of the pass transistor 44 that connects the logic circuits 41 and 45.

When inputting the output of the logic circuit 41 to the logic circuit 45 via the pass transistor 44, a supply voltage is applied to the gate of the pass transistor 44 to turn it on. In that case, however, the signal level of the logic signal inputted to the logic circuit 45 is lowered by the threshold voltage of the pass transistor 44.

In contrast, in the semiconductor device according to this embodiment, since the voltage generating device 42 having the voltage generating circuit with the voltage raising function of the present invention is connected to the gate of the pass transistor 44 via the switching element 43, when the logic signal outputted from the logic circuit 41 is inputted into the logic circuit 45, a voltage raised by the voltage generating device 42 to a level higher than the supply voltage can be applied to the gate of the pass transistor 44 by turning on the switching element 43. Therefore, because the output of the voltage generating device 42 is higher than the supply voltage Vdd, a decrease in the level of the logic signal inputted into the logic circuit 45 resulting from the threshold loss of the pass transistor 44 can be prevented. That is, the deterioration of logic signal level when a logic signal transmits through a signal wiring in a semiconductor device can be prevented, thereby realizing a highly reliable semiconductor device.

First Modified Example

Figure 10:
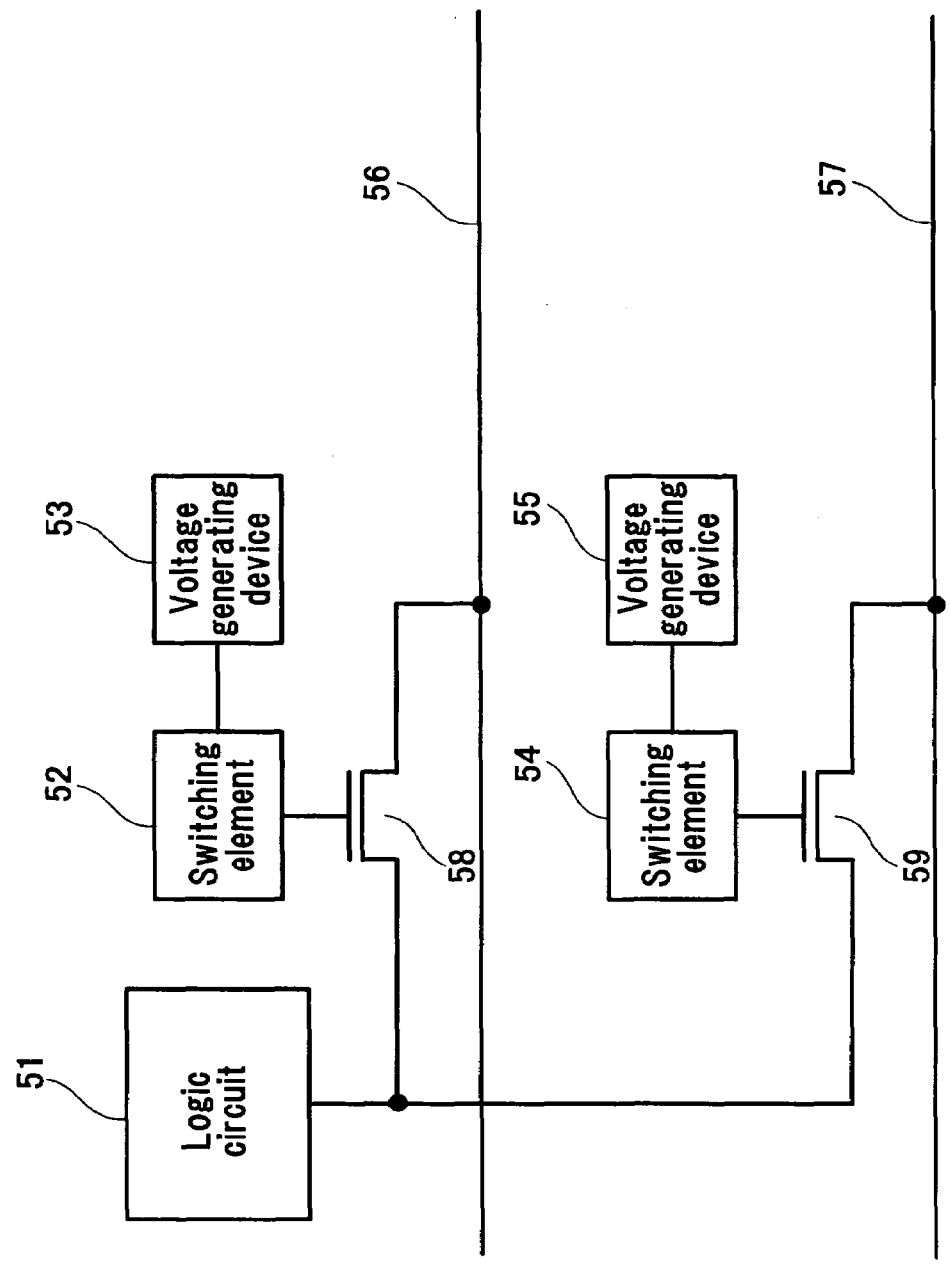
FIG. 10 is a block diagram showing the configuration of a semiconductor device according to a first modified example of the fifth embodiment of the present invention.

FIG. 10 is a block diagram schematically showing the configuration of a semiconductor device according to a first modified example of the fifth embodiment. The semiconductor device according to this modified example comprises a logic circuit 51, wirings 56 and 57 through which a logic signal outputted from the logic circuit 51 is transmitted, pass transistors 58 and 59 connected between the logic circuit 51 and wirings 56 and 57 respectively, and voltage generating devices 53 and 55 connected to the gates of the pass transistors 58 and 59 via switching elements 52 and 54 respectively. The voltage generating devices 53 and 55 comprise the voltage generating circuit having the voltage raising function of the present invention.

The semiconductor device according to this modified example supplies a logic signal from the logic circuit 51 to circuits and other components (not shown in Figs.) via the wirings 56 and 57. For example, when a logic signal is outputted from the logic circuit 51 to the wiring 56, the switching element 52 is turned on and a voltage raised by the voltage generating device 53 is applied to the gate of the pass transistor 58 connected to the wiring 56. Since the output voltage of the voltage generating device 53 is higher than the supply voltage, a lowered logic signal level outputted from the logic circuit 51 can be prevented, as explained above. When a logic signal is outputted from the logic circuit 51 to the wiring 57, the same effect can be produced by turning on switching element 54.

In this modified example, the number of wirings that supply a logic signal from the logic circuit 51 is not be limited to two as in FIG. 10, but may be three or more, or just one.

Second Modified Example

Figure 11:
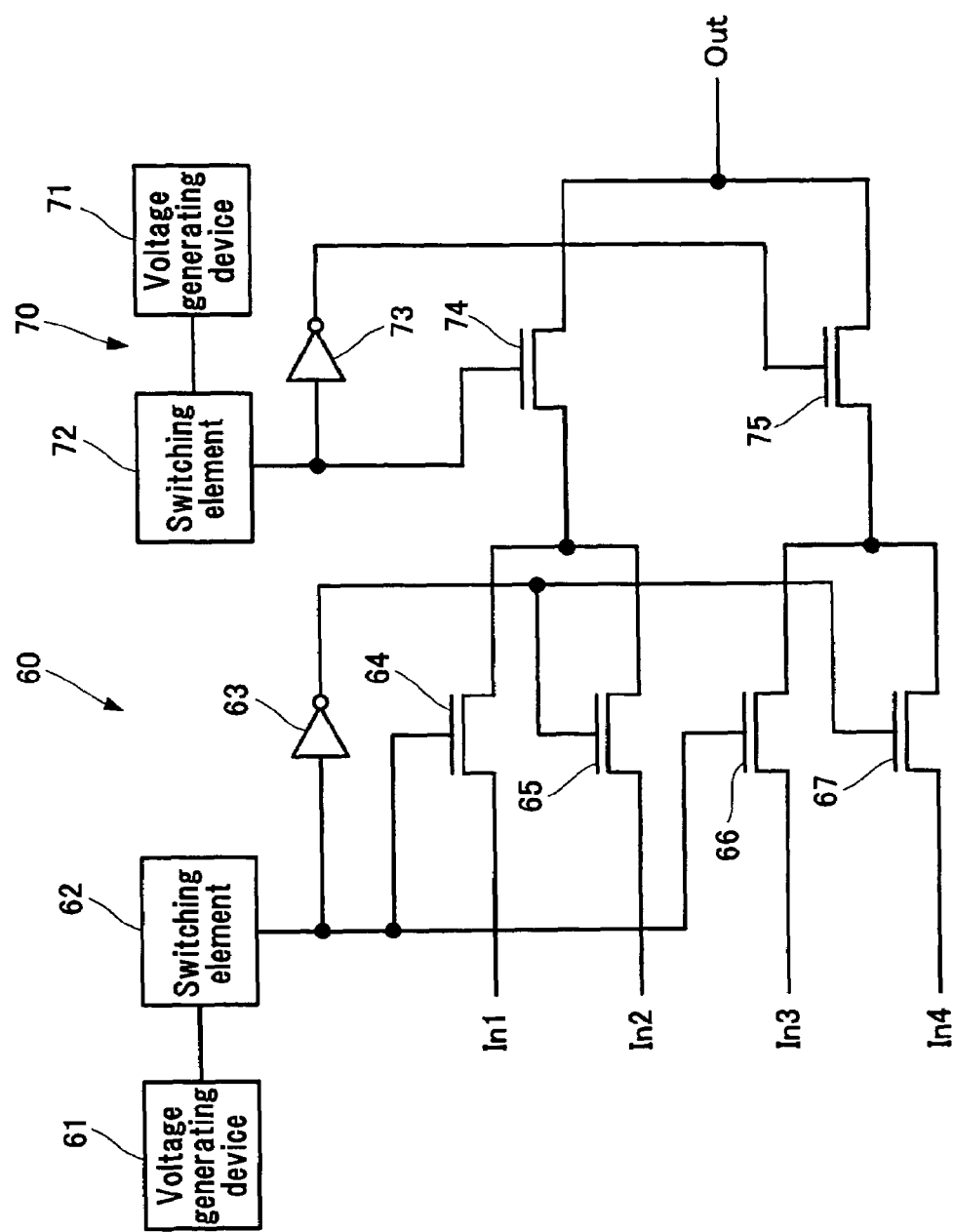
FIG. 11 is a block diagram showing the configuration of a semiconductor device according to a second modified example of the fifth embodiment of the present invention.

FIG. 11 is a block diagram schematically showing the configuration of a semiconductor device according to a second modified example of the fifth embodiment. The semiconductor device according to this modified example comprises selection gates 60 and 70 which are arranged in two steps and can achieve the function of a multiplexer. The selection gate 60 in the first step comprises pass transistors 64–67 into which input signals In1–In4 are inputted, and a voltage generating device 61 connected to the gates of the pass transistors 64–67 via a switching element 62. An inverter 63 is connected between the switching element 62 and the gates of the pass transistors 65 and 67; and the voltage generating device 61 comprises the voltage generating circuit having the voltage raising function of the invention. The selection gate 70 in the second step comprises a pass transistor 74 into which an input signal In1 or input signal In2 is alternatively inputted by two pass transistors 64 and 65, a pass transistor 75 into which an input signal In3 or input signal In4 is alternatively inputted by two pass transistors 66 and 67, and a voltage generating device 71 connected to the gates of the pass transistors 74 and 75 via a switching element 72. An inverter 73 is connected between the gate of the pass transistor 75 and the switching element 72, and the voltage generating device 71 comprises the voltage generating circuit having the voltage raising function of the invention.

In the semiconductor device (multiplexer) according to this modified example, a raised voltage higher than the supply voltage is applied to the gates of two or more of the pass transistors 64–67, 74 and 75 by the voltage generating devices 61 and 71 to achieve multiplexing functionality. Therefore, when one signal chosen from the input signals In1–In4 is outputted as an output signal Out, the signal levels of the input signals In1–In4, which are logic signals, can be prevented from being lowered.

The semiconductor device according to this modified example needs only function as a selection circuit which passes only one of two input signals. Specifically, in order to obtain the above-described effects, the device needs to have at least one pair of pass transistors (for example, pass transistors 64 and 65) whose output side is connected, among the pass transistors 64–67, 74 and 75 shown in FIG. 11.

According to the semiconductor device of this embodiment and its modifications (the first and second modified examples), lowered logic signal levels outputted from the logic circuit can be prevented by applying a raised voltage from the voltage generating device to the gates of the pass transistors. Therefore, it is not necessary to provide an amplifier or the like for increasing lowered signal levels, thereby reducing power consumption of the semiconductor device.

Reduced power consumption of LSIs can be achieved by applying the semiconductor device according to this embodiment to LSIs such as FPGAs (Field Programmable Gate Arrays), whose circuits can be changed after they are manufactured.

(Sixth Embodiment)

Figure 12:
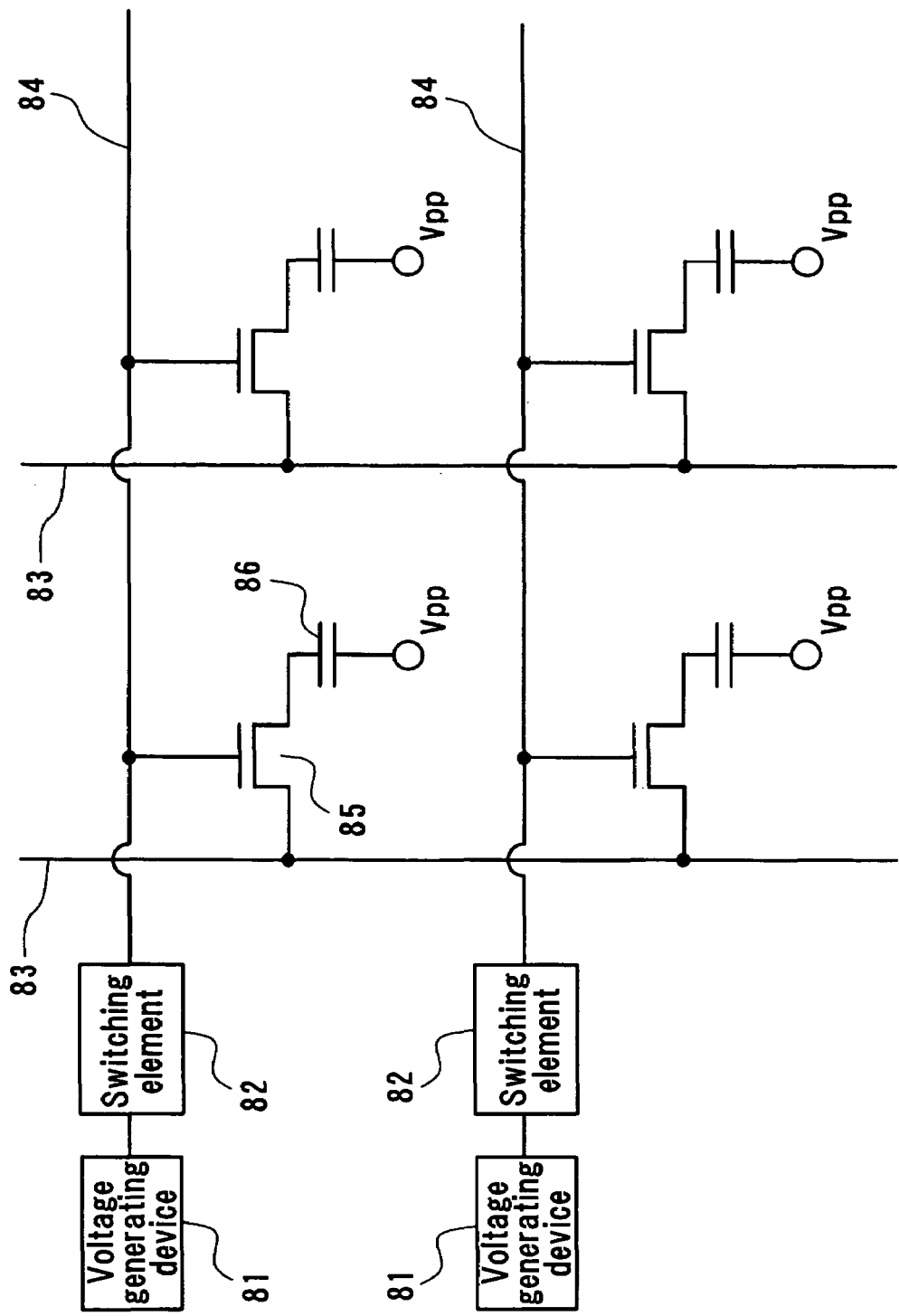
FIG. 12 is a block diagram showing the configuration of a semiconductor device according to a sixth embodiment of the present invention.

FIG. 12 is a block diagram schematically showing the configuration of a semiconductor device according to the sixth embodiment of the present invention. In the semiconductor device according to this embodiment, the voltage generating device comprising the voltage generating circuit of the invention is applied to the word line driver circuit for DRAM (Dynamic Random Access Memory). As shown in FIG. 12, the semiconductor device according to this embodiment comprises a plurality of bit lines 83 and word lines 84 provided in a memory cell array, and a voltage generating device 81 connected to each of the word lines 84 via a switching element 82. Each memory cell comprises a pass transistor 85 whose drain is connected to the bit line 83 and whose gate is connected to the word line 84, and a capacitor 86 one of whose electrodes is connected to the source of the pass transistor 85, and the other electrode of which is connected to a terminal which supplies a substrate voltage Vpp. In this embodiment, from the perspective of space saving for example, the voltage generating device according to the third embodiment, rather than that of the fourth embodiment, is used as the voltage generating device 81.

According to the semiconductor device of this embodiment, a raised voltage higher than the supply voltage can be applied to the gate of the pass transistor 85 of each memory cell by arranging the voltage generating device 81 of the invention in the word line driver circuit of the DRAM. This prevents the voltage maintained at the capacitor 86 from falling in memory reading. Thus, improvement in the reliability of DRAMs can be realized by preventing the voltage depression of the capacitor 86 during memory reading.

By using a ferroelectric as a dielectric material for the capacitor 86 which handles data storage in the memory cell of the semiconductor device (DRAM) according to this embodiment, it is also possible to make this semiconductor device function as an FeRAM.

The voltage generating device of this invention can be used for a non-DRAM semiconductor device if a pass transistor is used to access memory cells in the device. By providing the voltage generating device comprising the voltage generating circuit of the present invention with a wiring or especially a word line driver circuit for accessing memory cells of the devices below, effects similar to those produced by this embodiment (DRAM) can be achieved: for example, an SRAM comprising field-effect transistors and flip-flops; a memory comprising field-effect transistors and resistor elements (e.g., phase change memory whose resistor element comprises phase change materials such as GeSbTe, MRAM (Magnetoresistive Random Access Memory) whose resistor element comprises a magnetic tunnel-junction (MTJ) element, etc.).

(Seventh Embodiment)

Figure 13:
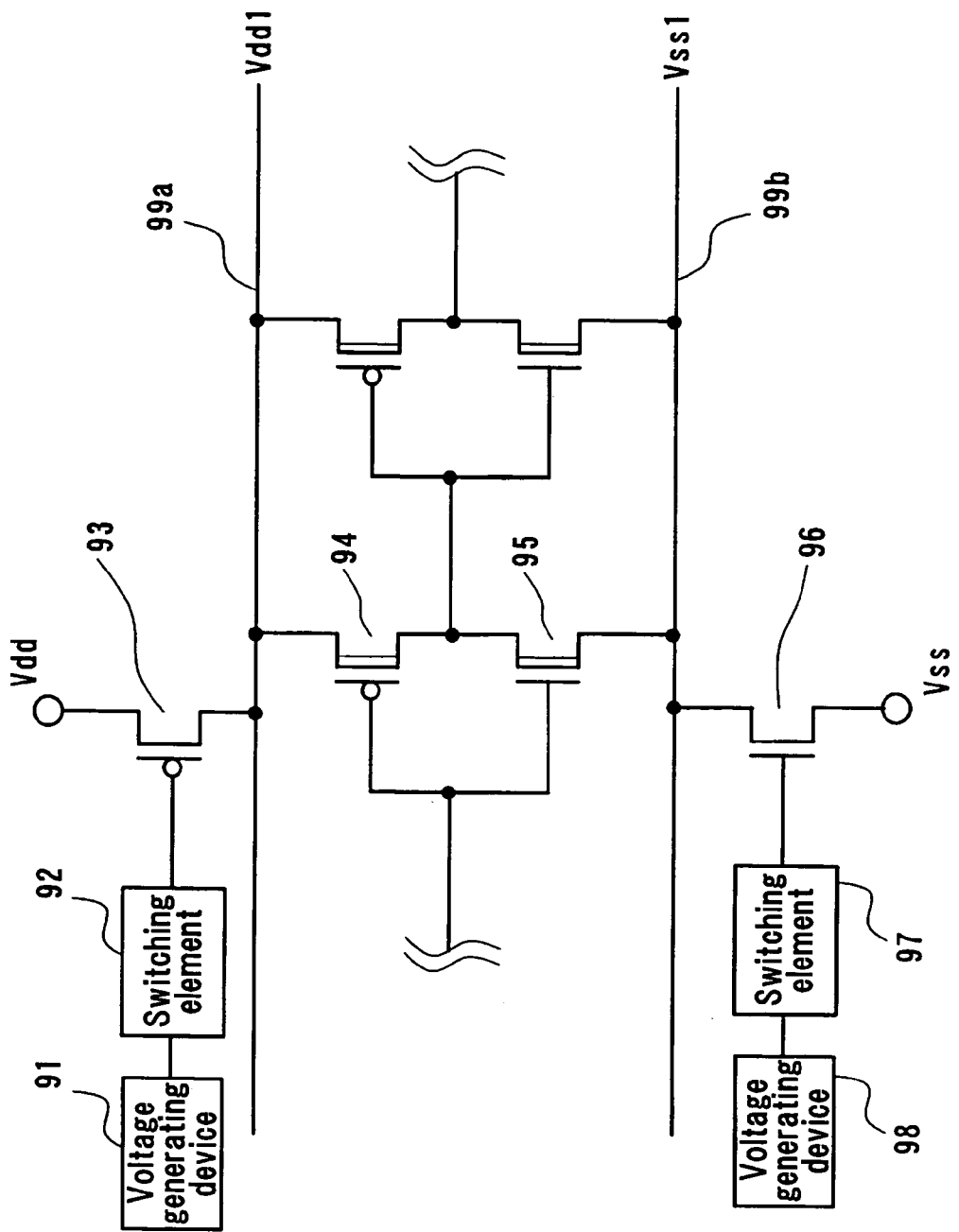
FIG. 13 is a block diagram showing the configuration of a semiconductor device according to a seventh embodiment of the present invention.
Figure 14:
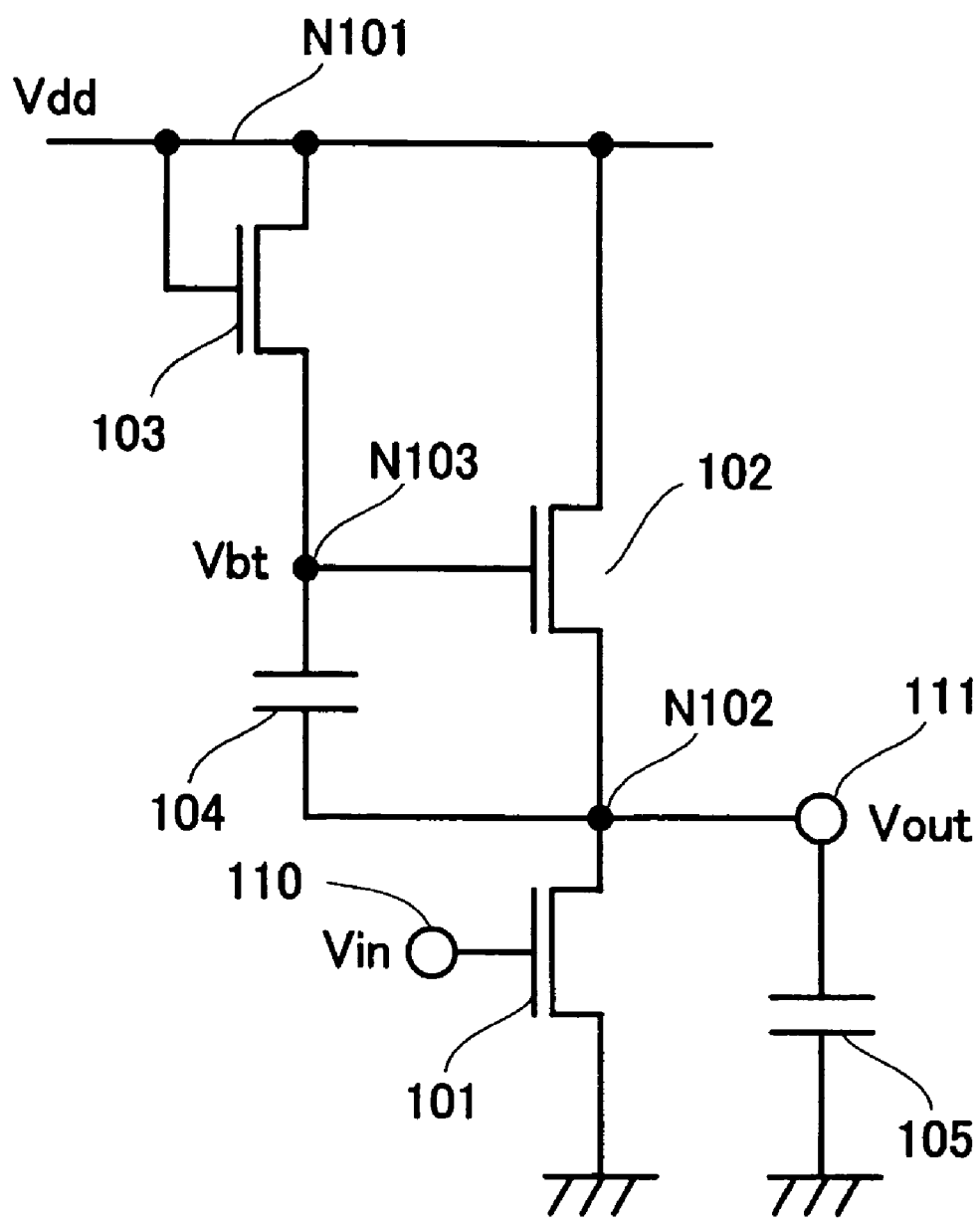
FIG. 14 is a circuit diagram showing the structure of a bootstrap circuit in the prior art.
Figure 15:
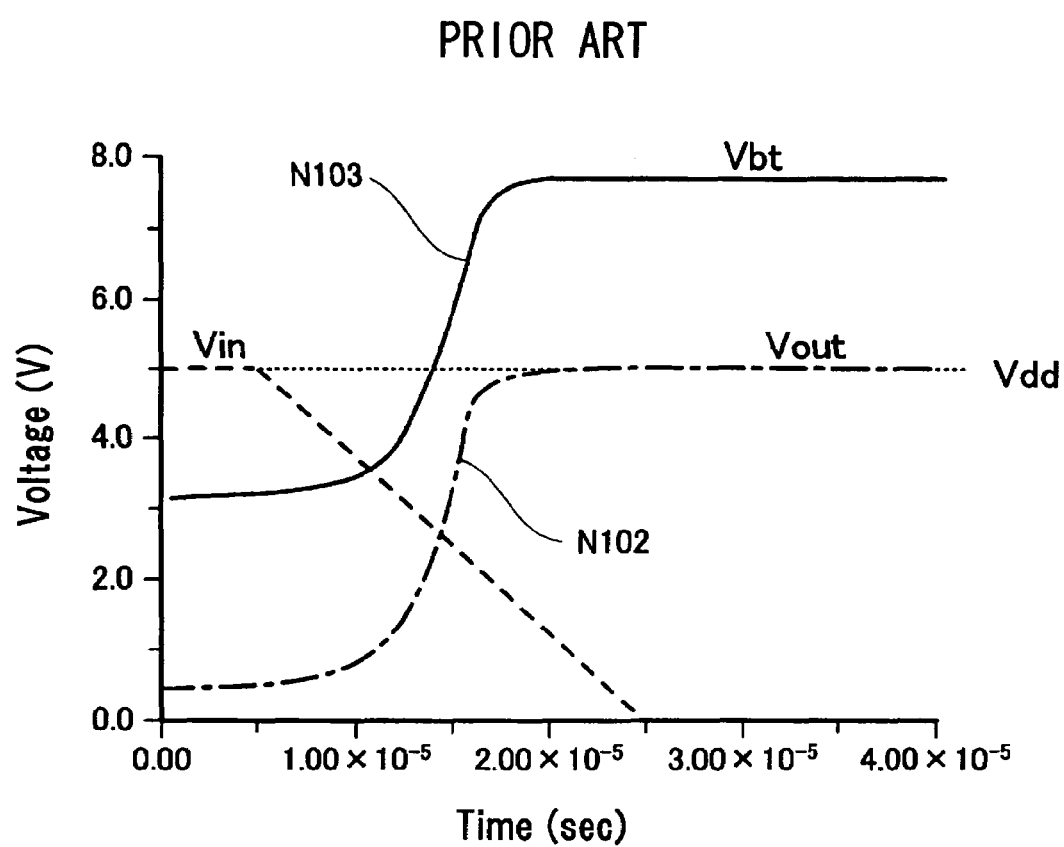
FIG. 15 is a drawing showing the change over time of the input voltage, output voltage and the voltage of the connecting node in the bootstrap circuit shown in FIG. 14.

FIG. 13 is a block diagram showing the configuration of a semiconductor device according to the seventh embodiment of the present invention. The semiconductor device according to this embodiment comprises a power line 99a that receives a supply voltage Vdd from a power supply terminal and supplies a high voltage Vdd1 to a logic circuit, and a ground line 99b that receives a ground voltage Vss from a ground terminal and supplies a low voltage Vss1 to the logic circuit. The semiconductor device further comprises a high-threshold MIS transistor 93 which is a p-channel MISFET connected between the power supply terminal and power line 99a, a voltage generating device 91 connected to the gate of the high-threshold MIS transistor 93 via a switching element 92, a high-threshold MIS transistor 96 which is an n-channel MISFET connected between the ground terminal and ground line 99b, and a voltage generating device 98 connected to the gate of the high-threshold MIS transistor 96 via a switching element 97. The logic circuit comprises a plurality of inverter circuits, each consisting of a low-threshold p-channel MIS transistor 94 and low-threshold n-channel MIS transistor 95. Herein, the voltage generating devices 91 and 98 comprise the voltage generating circuit having the voltage raising function of the present invention.

In the logic circuit as shown in FIG. 13, in order to increase the driving current of the inverter circuits, the low-threshold MIS transistors 94 and 95 are used, while the high-threshold MIS transistors 93 and 96 are used in the portions where a leakage current may cause problems. Moreover, in this embodiment, the high-threshold p-channel MIS transistor 93 is connected between the power line 99a and power supply terminal, and the high-threshold n-channel MIS transistor is connected between the ground line 99b and earth terminal. Such a circuit using MIS transistors having different threshold voltages is called an MTCMOS (Multi Threshold CMOS).

In the semiconductor device according to this embodiment, the switching element 97 is turned on when the logic circuit is in operation, and a raised voltage outputted from the voltage generating device 98 is applied to the gate of the high-threshold MIS transistor 96 (n-channel MISFET). Specifically, to drive the logic circuit, while a voltage lower than the threshold voltage of the high threshold MIS transistor 93 (for example, 0 V) is applied to the gate of the high threshold MIS transistor 93 from a gate control line (not shown), the switching element 97 is turned on. Thus, a voltage higher than the supply voltage Vdd is applied to the gate of the high-threshold MIS transistor 96. Therefore, the high-threshold MIS transistor 96 will be overdriven, thereby increasing the function to drive the logic circuit. In such a manner, this embodiment can achieve an MTCMOS with higher driving current than known MTCMOSs. When the logic circuit is on standby, a voltage lower than the threshold voltage of the high-threshold MIS transistor 96 (for example, 0 V) is applied to the gate of the high-threshold MIS transistor 96 from a gate control line (not shown). At the same time, the switching element 92 is turned on, and the gate of the high-threshold MIS transistor 93 and voltage generating device 91 are connected. By these operations, a voltage higher than the supply voltage Vdd is applied to the gate of the high-threshold MIS transistor 93. For this reason, the leakage current flowing from the power supply terminal to the ground terminal in the sub-threshold region of the high-threshold MIS transistor 93 (p-channel MISFET) can be reduced. Accordingly, this embodiment can achieve an MTCMOS which can more effectively inhibit the off-leak current while the circuit is on standby compared to known MTCMOSs.

In FIG. 13, although the voltage generating devices are disposed on both the power line side and ground line side, the voltage generating device may be disposed on only one side. An MTCMOS having a higher driving current than known MTCMOSs can be achieved by locating an n-channel high-threshold MIS transistor between the ground line and ground terminal, and supplying a voltage raised by the voltage generating device of the present invention to the gate of the MIS transistor. An MTCMOS having a higher capability to inhibit off-leak current than known MTCMOSs can also be achieved by locating a p-channel high-threshold MIS transistor between the power line and power supply terminal, and applying a voltage raised by the voltage generating device of the present invention to the gate of the MIS transistor.

The semiconductor device according to this embodiment can also be used in baseband signal processing LSIs of portable devices for which reduced power consumption is desired, especially personal digital cellular phones (PDCs) and personal digital assistants (PDAs). Its use can reduce the power consumption and improve the performance of those portable devices, and achieves energy-saving and environment-friendly portable devices.

(INDUSTRIAL APPLICABILITY)

According to the present invention, a ferroelectric capacitor and paraelectric capacitor are connected serially and a voltage raising function is produced by using the voltage induced by the polarization of the ferroelectric capacitor so that a voltage generating circuit and a voltage generating device which can stably supply a raised voltage, a semiconductor device using the same, and the method for driving the same can be achieved. Also, these can be applied to various kinds of devices to provide high-performance devices.

What is claimed is:

1. A voltage generating circuit comprising:
a first capacitor,
a second capacitor which is a ferroelectric capacitor serially connected to the first capacitor,
an output terminal,
a third capacitor which grounds the output terminal,
a supply voltage supplying terminal,
a first switch which connects a connecting node of the first and second capacitors and the supply voltage supplying terminal, and
a second switch which connects the connecting node and the output terminal;
wherein during a first period, with the first switch and second switch placed in the OFF state, a first terminal of the first capacitor opposed to the connecting node is grounded and a second terminal of the second capacitor opposed to the connecting node is provided with a supply voltage;
wherein during a second period following the first period, the first terminal is provided with the supply voltage and the second switch is placed in the ON state;
wherein during a third period following the second period, the first switch is placed in the ON state, the second switch is placed in the OFF state, and the second terminal is grounded;
wherein during a fourth period following the third period, the second terminal is provided with the supply voltage; and
wherein thereafter the first through fourth periods are repeated.

2. A voltage generating circuit according to claim 1, wherein each of the first switch and second switch is composed of a p-channel MISFET; and
wherein the substrate of the p-channel MISFET constituting each of the first switch and the second switch is connected to the supply voltage supplying terminal.

3. A method for driving a voltage generating circuit comprising;
a first capacitor,
a second capacitor which is a ferroelectric capacitor serially connected to the first capacitor,
an output terminal,
a third capacitor which grounds the output terminal, a supply voltage supplying terminal,
a first switch which connects a connecting node of the first and second capacitors and the supply voltage supplying terminal, and
a second switch which connects the connecting node and the output terminal;
the method comprising:
a first period during which a first terminal of the first capacitor opposed to the connecting node is grounded, a second terminal of the second capacitor opposed to the connecting node is provided with a supply voltage, and the first switch and the second switch are placed in the OFF state;
a second period following the first period, during which the first terminal is provided with the supply voltage and the second switch is placed in the ON state;
a third period following the second period, during which the first switch is placed in the ON state, the second switch is placed in the OFF state, and the second terminal is grounded;
a fourth period following the third period, during which the second terminal is provided with the supply voltage;
wherein thereafter the first through fourth periods are repeated.

4. A voltage generating circuit comprising two voltage generating circuits according to claim 1,
wherein one of the voltage generating circuits has the output terminal connected to the supply voltage supplying terminal of the other voltage generating circuit.

5. A voltage generating device comprising:
a voltage generating circuit according to claim 1;
a control circuit for supplying to the voltage generating circuit driving signals for firstly placing the first switch and the second switch in the OFF state, grounding the first terminal, and providing the second terminal with the supply voltage, then secondly providing the first terminal with the supply voltage, placing the second switch in the ON state, then thirdly placing the first switch and the second switch in the ON and OFF states respectively, grounding the second terminal, and then fourthly providing the second terminal with the supply voltage; and
a voltage detection circuit for detecting an output voltage at the output terminal;
wherein the voltage detection circuit provides the control circuit with a control signal in response to the detected output voltage; and
wherein the control circuit provides or stops providing the driving signals in response to the control signal.

6. A voltage generating device according to claim 5,
wherein the voltage detection circuit:
provides an enabling signal so that the control circuit can provide the driving signals when the value of the output voltage is equal to or less than a first value;
continues to provide the enabling signal until the value of the output voltage is equal to or more than a second value;
provides a stop signal so that the control circuit stops providing the driving signals when the value of the output voltage is equal to or more than the second value; and
continues to provide the stop signal until the output voltage is equal to or less than the first value.

7. A method for driving a voltage generating device comprising;
a voltage generating circuit according to claim 1,
a control circuit for supplying to the voltage generating circuit driving signals, and
a voltage detection circuit for supplying a control signal to the control circuit;
the method comprising:
a detecting step wherein the voltage detection circuit detects an output voltage at the output terminal in the voltage generating circuit;
an enabling step wherein the voltage detection circuit provides an enabling signal so that the control circuit can provide the driving signals when the value of the output voltage is equal to or less than a first value, and the voltage detection circuit continues to provide the enabling signal until the value of the output voltage is equal to or more than a second value;
a driving step wherein the control circuit provides the voltage generating circuit with the driving signals upon receipt of the enabling signal;
a disabling step wherein the voltage detection circuit provides a stop signal so that the control circuit can stop providing the driving signals when the value of the output voltage is equal to or more than the second value, and the voltage detection circuit continues to provide the stop signal until the value of the output voltage is equal to or less than the first value; and
a stopping step wherein the control circuit stops providing the voltage generating circuit with the driving signals upon receipt of the stop signal.

8. A voltage generating device comprising:
a voltage generating circuit according to claim 1;
a control circuit for supplying to the voltage generating circuit driving signals for firstly placing the first switch and the second switch in the OFF state, grounding the first terminal, and providing the second terminal with the supply voltage, then secondly providing the first terminal with the supply voltage, placing the second switch in the ON state, then thirdly placing the first switch and the second switch in the ON and OFF states respectively, grounding the second terminal, and then fourthly providing the second terminal with the supply voltage; and
a voltage detection circuit for detecting an output voltage at the output terminal;
wherein the voltage detection circuit provides a predetermined signal when the value of the detected output voltage is equal to or less than a predetermined value;
wherein in the state that the control circuit provides the driving signals for supplying the first terminal and second terminals with the supply voltage and supplying such voltages that the first switch is placed in the ON state and the second switch is placed in the OFF state, when the control circuit receives the predetermined signal, the control circuit provides the driving signals for grounding the first terminal, supplying the supply voltage to the second terminal, and supplying such voltages that the first switch and the second switch are placed in the OFF state.

9. A voltage generating device comprising:
a first voltage generating circuit according to claim 1;
a second voltage generating circuit configured to comprise a fourth capacitor, a fifth capacitor which is a ferroelectric capacitor connected in series to the fourth capacitor, a sixth capacitor for grounding the output terminal, a third switch for connecting a second connecting node between the fourth capacitor and the fifth capacitor to the supply voltage supplying terminal, and a fourth switch for connecting the second connecting node to the output terminal;

a first control circuit for providing the first voltage generating circuit with first driving signals for firstly placing the first switch and the second switch in the OFF state, grounding the first terminal, and providing the second terminal with the supply voltage, and then secondly providing the first terminal with the supply voltage and placing the second switch in the ON state, and then thirdly placing the first switch and the second switch in the ON and OFF states respectively and grounding the second terminal, and then fourthly providing the second terminal with the supply voltage;

a second control circuit for providing the second voltage generating circuit with second driving signals for firstly placing the third switch and the fourth switch in the OFF state, grounding a third terminal of the fourth capacitor opposed to the second connecting node and providing a fourth terminal of the fifth capacitor opposed to the second connecting node with the supply voltage, then secondly providing the third terminal with the supply voltage and placing the fourth switch in the ON state, then thirdly placing the third switch and the fourth switch in the ON and OFF states respectively and grounding the fourth terminal, and then fourthly providing the fourth terminal with the supply voltage; and a voltage detection circuit for detecting an output voltage at the output terminal;

wherein an output timing of the first driving signals is shifted from an output timing of the second driving signals by a half cycle;

wherein the voltage detection circuit provides the first control circuit and the second control circuit with a control signal in response to the detected output voltage;

wherein the first control circuit provides or stops providing the first driving signals in response to the control signal; and wherein the second control circuit provides or stops providing the second driving signals in response to the control signal.

10. A voltage generating device according to claim 9, wherein the voltage detection circuit:

provides an enabling signal so that the first control circuit and the second control circuit can provide the first driving signals and the second driving signals respectively when the value of the output voltage is equal to or less than a first value;

continues to provide the enabling signal until the value of the output voltage is equal to or more than a second value;

provides a stop signal so that the first control circuit and the second control circuit can stop providing the first driving signals and the second driving signals respectively when the value of the output voltage is equal to or more than the second value; and continues to provide the stop signal until the value of the output voltage is equal to or less than the first value.

11. A method for driving a voltage generating device comprising:

a first voltage generating circuit according to claim 1, a second voltage generating circuit configured to comprise a fourth capacitor, a fifth capacitor which is a ferroelectric capacitor connected in series to the fourth capacitor, a sixth capacitor for grounding the output terminal, a third switch for connecting a second connecting node between the fourth capacitor and the fifth capacitor to the supply voltage supplying terminal, and a fourth switch for connecting the second connecting node to the output terminal, a first control circuit for providing the first voltage generating circuit with first driving signals for firstly placing the first switch and the second switch in the OFF state, grounding the first terminal, and providing the second terminal with the supply voltage, and then secondly providing the first terminal with the supply voltage and placing the second switch in the ON state, and then thirdly placing the first switch and the second switch in the ON and OFF states respectively and grounding the second terminal, and then fourthly providing the second terminal with the supply voltage, a second control circuit for providing the second voltage generating circuit with second driving signals for firstly placing the third switch and the fourth switch in the OFF state, grounding a third terminal of the fourth capacitor opposed to the second connecting node and providing a fourth terminal of the fifth capacitor opposed to the second connecting node with the supply voltage, then secondly providing the third terminal with the supply voltage and placing the fourth switch in the ON state, then thirdly placing the third switch and the fourth switch in the ON and OFF states respectively and grounding the fourth terminal, and then fourthly providing the fourth terminal with the supply voltage, and a voltage detection circuit for detecting an output voltage at the output terminal;

the method comprising:

a detecting step wherein the voltage detection circuit detects an output voltage at the output terminal;

an enabling step wherein the voltage detection circuit provides an enabling signal so that the first control circuit and the second control circuit can provide the first driving signals and the second driving signals respectively when the value of the detected output voltage is equal to or less than a first value, and the voltage detection circuit continues to provide the enabling signal until the value of the output voltage is equal to or more than a second value;

a disabling step wherein the voltage detecting circuit provides a stop signal so that the first control circuit and the second control circuit can stop providing the first driving signals and the second driving signals respectively when the value of the output voltage is equal to or more than the second value, and the voltage detection circuit continues to provide the stop signal until the value of the output voltage is equal to or less than the first value;

a first driving step wherein the first control circuit provides the first voltage generating circuit with the first driving signals upon receipt of the enabling signal;

a first stopping step wherein the first control circuit stops providing the first voltage generating circuit with the first driving signals upon receipt of the stop signal;

a second driving step wherein the second control circuit provides the second voltage generating circuit with the second driving signals, at a timing shifted by a half cycle from the output timing of the first driving signals, upon receipt of the enabling signal; and a second stopping step wherein the second control circuit stops providing the second voltage generating circuit with the second driving signals upon receipt of the stop signal.

12. A semiconductor device comprising:
a voltage generating device comprising a voltage generating circuit according to claim 1,
a first pass transistor, and
a fifth transistor which connects an output terminal of the voltage generating device to a first gate of the first pass transistor;
wherein when the fifth switch is placed in the ON state, a voltage is applied to the first gate from the output terminal of the voltage generating device so that the first pass transistor is placed in the ON state to output an input signal as an output signal.

13. A semiconductor device according to claim 12 further comprising a logic circuit which supplies an input signal to the first pass transistor, or
a wiring which transmits an output signal from the first pass transistor.

14. A semiconductor device according to claim 12 comprising:
a second pass transistor, and
an inverter connected between the first gate of the first pass transistor and a second gate of the second pass transistor;
wherein an output terminal of the first pass transistor and an output terminal of the second pass transistor are connected;
the inverter reverses a voltage applied to the first gate and applies the reversed voltage to the second gate; and
either an input signal to the first pass transistor or an input signal to the second pass transistor is outputted as an output signal, depending on whether the fifth switch is placed in the ON or OFF state.

15. A semiconductor device comprising:
a memory cell,
a sixth switch, and
a voltage generating device comprising a voltage generating circuit according to claim 1 which is connected to a word line of the memory cell via the sixth switch;
wherein the sixth switch is placed in the ON state during the read period of the memory cell.

16. A semiconductor device according to claim 15, wherein the memory cell comprises a third pass transistor and a seventh capacitor.

17. A semiconductor device comprising:
a voltage generating device comprising a voltage generating circuit according to claim 1,
a logic circuit comprising an MIS transistor,
a high-threshold n-channel MISFET connecting the logic circuit to a predetermined voltage and having a threshold voltage larger than that of the MIS transistor, and
a seventh switch for connecting a gate of the high-threshold n-channel MISFET to the voltage generating device;
wherein the seventh switch is placed in the ON state while the logic circuit is in operation and in the OFF state while the logic circuit is on standby.

18. A semiconductor device comprising:
a voltage generating device comprising a voltage generating circuit according to claim 1,
a logic circuit comprising an MIS transistor,
a high-threshold p-channel MISFET connecting the logic circuit to a predetermined voltage and having a threshold voltage larger than that of the MIS transistor, and
an eighth switch for connecting a gate of the high-threshold p-channel MISFET to the voltage generating device;
wherein the eighth switch is placed in the ON state while the logic circuit is on standby and in the OFF state while the logic circuit is in operation.

19. A method for driving a semiconductor device comprising;
a voltage generating device which comprises a voltage generating circuit according to claim 1,
a logic circuit comprising an MIS transistor,
a high-threshold n-channel MISFET connecting the logic circuit to a predetermined voltage and having a threshold voltage larger than that of the MIS transistor, and
a seventh switch for connecting a gate of the high-threshold n-channel MISFET to the voltage generating device;
the method comprising:
an operating step wherein while the logic circuit is in operation, the seventh switch is placed in the ON state and a high voltage is supplied by the voltage generating device to the gate of the high-threshold n-channel MISFET; and
a standby step wherein while the logic circuit is on standby, the seventh switch is placed in the OFF state and a voltage lower than the threshold voltage of the high-threshold n-channel MISFET is supplied to the gate of the high-threshold n-channel MISFET.

20. A method for driving a semiconductor device comprising:
a voltage generating device which comprises a voltage generating circuit according to claim 1,
a logic circuit comprising an MIS transistor,
a high-threshold p-channel MISFET connecting the logic circuit to a predetermined voltage and having a threshold voltage larger than that of the MIS transistor, and
an eighth switch for connecting a gate of the high-threshold p-channel MISFET to the voltage generating device;
the method comprising:
a standby step wherein while the logic circuit is on standby, the eighth switch is placed in the ON state and a high voltage is supplied by the voltage generating device to the gate of the high-threshold p-channel MISFET; and
an operating step wherein while the logic circuit is in operation, the eighth switch is placed in the OFF state and a voltage lower than the threshold voltage of the high-threshold p-channel MISFET is supplied to the gate of the high-threshold p-channel MISFET.

* * * * *

UNITED STATES PATENT AND TRADEMARK OFFICE
CERTIFICATE OF CORRECTION

| | | |
|---|---|---|
| PATENT NO. | : 7,053,693 B2 | Page 1 of 1 |
| APPLICATION NO. | : 10/765175 | |
| DATED | : May 30, 2006 | |
| INVENTOR(S) | : Kenji Toyoda et al. | |

It is certified that error appears in the above-identified patent and that said Letters Patent is hereby corrected as shown below:

On the title page

Under section (30) Foreign Application Priority Data, delete "Mar. 9, 2003 (JP).......PCT/JP03/11227"

Under section (22), insert -- (63) Related U.S. Application Data, Continuation of application No. PCT/JP03/11227, filed on September 3, 2003 --

Signed and Sealed this

Twenty-sixth Day of December, 2006

JON W. DUDAS
*Director of the United States Patent and Trademark Office*